United States Patent [19]

Nakayama et al.

[11] Patent Number: 5,371,705
[45] Date of Patent: Dec. 6, 1994

[54] INTERNAL VOLTAGE GENERATOR FOR A NON-VOLATILE SEMICONDUCTOR MEMORY DEVICE

[75] Inventors: Takeshi Nakayama; Yasushi Terada; Yoshikazu Miyawaki; Tomoshi Futatsuya; Shinichi Kobayashi, all of Hyogo, Japan

[73] Assignee: Mitsubishi Denki Kabushiki Kaisha, Tokyo, Japan

[21] Appl. No.: 66,300

[22] Filed: May 24, 1993

[30] Foreign Application Priority Data

May 25, 1992 [JP] Japan .................... 4-131200
Apr. 27, 1993 [JP] Japan .................... 5-100752

[51] Int. Cl.$^5$ .............................. G11C 7/00
[52] U.S. Cl. .................. 365/189.09; 365/189.07; 365/189.11; 365/185; 365/226
[58] Field of Search .............. 365/189.11, 189.07, 365/230.06, 189.09, 226, 185

[56] References Cited

U.S. PATENT DOCUMENTS 4,972,375 11/1990 Ueno et al. .................... 365/189.11

OTHER PUBLICATIONS

T. Jinbo et al, "A 5V-Only 16Mb Flash Memory with Sector-Erase Mode", ISSCC 92 Slide Supplement, pp. 114–115.

Primary Examiner—Eugene R. LaRoche
Assistant Examiner—F. Niranjan
Attorney, Agent, or Firm—Lowe, Price, LeBlanc & Becker

[57] ABSTRACT

The semiconductor device includes a voltage generator for generating selectively a signal of a first level or a second level onto a first supply line, and a voltage converter using voltage signals on the first supply line and a second supply line for producing a signal of the voltage level on the first or the second supply line in accordance with an input signal, and a voltage level shifter for detecting the level of the voltage on the first supply line to shift in voltage level a signal on the second power supply line toward the first level when the voltage on the first supply line approaches the first level. The difference of the voltages on the first and second supply lines can be reduced to improve the break-down characteristics of a transistor included in the voltage converter, resulting in a reliable semiconductor device.

51 Claims, 24 Drawing Sheets

INTERNAL VOLTAGE GENERATOR FOR A NON-VOLATILE SEMICONDUCTOR MEMORY DEVICE

BACKGROUND OF THE INVENTION

1. Field of the Invention

The present invention relates to a circuit for generating internal voltage in a semiconductor device, and more particularly, to a structure of a circuit for generating a programming voltage and an erase voltage used for programming and erasing in a non-volatile semiconductor memory device.

2. Description of the Background Art

FIG. 1A schematically shows a sectional structure of a memory cell of a flash memory, and FIG. 1B shows an electrical equivalent circuit thereof. Referring to FIG. 1A, a flash memory cell includes high concentration impurity regions 102a and 102b formed on the surface of a semiconductor substrate 100, a floating gate 108 formed on a channel region 104 between impurity regions 102a and 102b with a thin gate insulating film 106 thereunder, and a control gate 112 formed on floating gate 108 with an interlayer insulating film 110 thereunder. Semiconductor substrate 100 may be an epitaxially grown layer or a well region. The flash memory cell includes a structure of a MOS (insulation gate type) transistor having a two layered gate structure. Impurity region 102a provides a drain region, and impurity region 102b provides a source region. In FIG. 1A, impurity regions 102a and 102b are connected to a drain electrode D and a source electrode S, respectively. Control gate 112 is connected to a control gate electrode CG.

The flash memory cell shown in FIG. 1A stores a binary data of "0" and "1" according to the amount of charge stored in floating gate 108. Floating gate 108 is in an electrically floating state so that data can be stored in a non-volatile manner.

The flash memory includes a memory cell array having a plurality of such memory cells arranged in a matrix. Referring to FIG. 1B, a flash memory cell in a memory cell array has its control gate electrode CG connected to a word line WL, its drain electrode D connected to a bit line BL, and its source electrode S connected to a source line SL. A row of memory cells are connected to the word line WL, and a column of memory cells are connected to the bit line BL. The source line SL is provided in common to a predetermined number of memory cells (sector unit, page unit).

The injection of charge (electrons) into the floating gate of a flash memory cell and the draw of charge (electrons) from the floating gate is carried out in an electrical manner set forth in the following.

The injection operation of electrons into a floating gate will first be described with reference to FIG. 2. Referring to FIG. 2, a voltage of approximately 6 V is applied to the drain electrode D, and a high voltage of approximately 12 V is applied to the control gate CG. The source electrode S is set to 0 V. Under this state, a channel is formed between impurity regions 102a and 102b by the high voltage applied to the control gate electrode CG to cause a current flow. The carriers in this channel current are accelerated to become hot carriers by the drain electric field of high intensity formed in the proximity of impurity region 102a. These hot carriers become avalanche hot carriers by impact ionization, Electrons of these avalanche hot carriers are accelerated towards floating gate 108 to be stored therein by the high voltage applied to the control gate electrode CG. This state in which electrons are stored in floating gate 108 is called "a programmed state", and corresponds to the state where data "0" is stored.

The operation of drawing electrons from a floating gate is carried out as shown in FIG. 3. Referring to FIG. 3, the drain electrode D is set to an electrically floating state, a high voltage of approximately 12 V is applied to the source electrode S, and the control gate electrode CG is set to 0 V. In such a state, a high electric field is applied between floating gate 108 and impurity region 102b to generate. Fawler-Nordheim type tunnel current, whereby electrons stored in floating gate 108 are drawn towards impurity region 102b. This state where electrons are drawn out from floating gate 108 is called "an erased state", and corresponds to the state of storing data "1".

In the programmed state where electrons are stored in floating gate 108, a channel is not easily formed in the channel region, whereby the threshold voltage Vth is shifted to a higher value to result in a threshold voltage of V2 as shown in FIG. 4.

In the state where electrons are drawn out from floating gate 108, a channel is easily formed in the channel region so that the threshold voltage is shifted to a lower value of V1 as shown in FIG. 4.

In reading out data, the source electrode S is set to ground potential of 0 V, the drain electrode D is supplied with a read out voltage of approximately 1-2 V, and the control gate electrode CG receives a voltage of approximately 5 V. The voltage value (5 V) applied to the control gate electrode CG at the time of read out is between the threshold voltages V1 and V2 shown in FIG. 4. In accordance with the information stored in the flash memory cell, current flows or not flows from impurity region 102a to impurity region 102b. Data read out is carried out by identifying the presence/absence of this current.

In the erasing operation of the above-described flash memory cell, a high voltage of approximately 12 V is applied to the source region (impurity region 102b). The memory cell suffers from limitations set forth in the following in this case. That is to say, the source impurity region requires a high breakdown voltage structure, and the source impurity region is increased in depth. Therefore, the gate length of the memory cell can not be reduced in order to prevent punch through, so that the memory cell size can not be reduced.

Furthermore, because a high voltage is applied to the source impurity region, a high electric field is generated in the proximity of the source impurity region as shown in FIG. 5. As a result, hot holes are generated to be trapped in a tunnel film (a very thin insulating film between source impurity region 102b and floating gate 108). The holes trapped in this tunnel insulating film reduces the number of programming times. Also, if the holes stored in the insulating film exceeds a predetermined amount, the insulating film is destructed.

Because the substrate current generated at the source impurity region is great in the erasing operation, the high voltage required for erasing can not be generated using an on-chip boosting circuit. A high voltage generating circuit must externally be provided.

A method of applying negative voltage to the control gate in an erasure operation is proposed to provide a device that can be operated by a 5 V only power source, has a large storage capacity, and that has an increased number of times of programming.

FIG. 6 shows the voltage applying conditions in such a negative gate voltage system. In the method shown in FIG. 6, a negative voltage of approximately −10 V is applied to the control gate electrode CG, a voltage of approximately 5 V is applied to the source electrode S, and the drain electrode D is set to an electrically floating state. In such a state, electrons are drawn from floating gate 108 towards source impurity region 102b via tunnel insulating film 106 by a Fawler-Nordheim type tunnel current because a high voltage of approximately 15 V is applied between source impurity region 102b and control gate 112 as in a conventional case.

FIG. 7 shows another voltage applying condition according to the negative gate voltage method. In the negative gate voltage method shown in FIG. 7, a power supply voltage of 5 V is applied to a semiconductor substrate (P well) 100, and a negative voltage of approximately −11 to −14 V is applied to the control gate electrode CG. The source electrode S and the drain electrode D respectively attain an electrically floating state. In this state, electrons are drawn from floating gate 108 towards substrate 100 by a Fawler-Nordheim type tunnel current via a tunnel insulating film (gate insulating film 106).

As described above, Fawler-Nordheim type tunneling current is used in the source-gate erasing method shown in FIG. 6 and in the substrate erasing method shown in FIG. 7. Although the voltage required for erasing is a high voltage such as 15 V–20 V in comparison with the source erasing method applying a high voltage of approximately 12 V to the source, a high breakdown voltage structure is not required since a high voltage is not applied to the source impurity region, and the amount of generated hot holes is also reduced.

Because a high voltage is not applied to the source in the gate negative voltage erasing method in which a negative voltage is applied to the control gate, the substrate current generated at the source impurity region is reduced. Therefore, the current required in an erasing operation is only the Fawler-Nordheim type tunnel current for drawing electrons stored in the floating gate. Thus, the current required in an erasing operation is reduced, so that the negative voltage to be applied to the control gate can be produced with an on-chip voltage down converter. This voltage down converter has a structure similar to a charge pumping circuit used in a boosting circuit for generating a high voltage to be applied at the time of programming in conventional art. Therefore, a flash memory of an external 5 V only power source is implemented by this negative gate voltage applying method. However, this negative gate voltage method requires provision of a positive voltage at the time of data read out and programming operations and a negative voltage at the time of erasing operation to the control gate.

FIG. 8 schematically shows the entire structure of a conventional flash memory. Referring to FIG. 8, a flash memory includes a memory cell array 200 having a plurality of memory cells MC arranged in a matrix of rows and columns, and an address latch 202 for latching applied address signals A0–An for generating an internal address signal. Memory cell array 200 includes a word line WL connected to memory cells MC of 1 row, a bit line BL connected to 1 column of memory cells, and a source line SL to which a predetermined number of memory cells MC are coupled in common. In FIG. 8, only one memory cell MC is typically shown. Memory cell array 200 may have a structure in which a predetermined number of memory cells of one word line WL are erased in the unit of a sector.

The flash memory further includes an X decoder 204 for decoding an internal row address signal from address latch 202 to generate a signal for selecting a corresponding word line, a word line driver 206 for applying a predetermined voltage to a corresponding word line according to a word line select signal from X decoder 204, a Y decoder 208 for decoding an internal column address signal from address latch 202 for generating a signal to select a corresponding column in memory cell array 200, and a Y selection gate 212 responsive to a column select signal from Y decoder 208 to connect a corresponding bit line BL to internal data buses 210a and 210b. Data bus 210a transmits read out data, and data bus 210b transmits program data. Data buses 201a and 210b may be the same data bus.

The flash memory further includes a program/erase control circuit 214 responsive to externally applied control signals CE, OE, and WE for generating a control signal required for various operations, a Vpp/Vcc generation circuit 216 for generating a high voltage Vpp or an operating power supply voltage Vcc from an external power supply voltage Vcc under the control of program/erase control circuit 214, a negative voltage generating circuit 218 for generating a negative voltage of a predetermined potential level under the control of program/erase control circuit 214, and a source potential generating circuit 220 for generating a voltage to be supplied to a source line SL under the control of program/erase control circuit 214.

Program/erase control circuit 214 determines the address signal latch timing of address latch 202, the decoder operation timing of X decoder 204, and the decoder operation timing of Y decoder 208. A signal CE is a chip enable signal instructing that this flash memory is selected. A signal OE is an output enable signal indicating that a data read out operation mode is instructed. A signal WE is a write enable signal indicating that a data programming operation mode is instructed. Program/erase control circuit 214 generates a control signal required for data erasing and programming of a memory cell when signals CE and WE are both active.

The flash memory further includes a sense amplifier 222 for detecting and amplifying the data applied on data bus 210a, a programming circuit 224 for providing program data to data bus 210b, and an input/output buffer 226 for carrying out data input/output with an external device of the memory. Sense amplifier 222 has a structure of a current detection type sense amplifier to generate and provide to input/output buffer 226 an internal read out data according to whether current flows or not in a selected column, i.e. a selected bit line. Programming circuit 224 generates a program data according to an internal program data from input/output buffer 226 to apply a predetermined voltage corresponding to program data to a selected bit line.

The output of sense amplifier 222 is supplied to program/erase control circuit 214 for identifying whether data is reliably erased or a desired program data is written properly in an erasing operation and a programming operation.

In an erasing operation, negative voltage generating circuit 218 is activated to generate a predetermined negative voltage under the control of program/erase control circuit 214. X decoder 204 decodes an internal row address signal from address latch 202. Word line driver 206 transmits the negative voltage from negative voltage generating circuit 218 to a selected word line.

During this erase operation, source potential generating circuit 220 generates and transmits to the source line SL a signal of the power supply voltage Vcc level under the control of program/erase control circuit 214. Y decoder 208 has not carried out a decode operation, and all the selection gates of Y selection gate 212 (provided corresponding to each bit line) all attain a nonconductive state. Thus, the bit line BL attains an electrically floating state. Under this state, an erase operation is carried out in a predetermined number of memory cells of 1 row or 1 sector connected to the selected word line.

Although an erase operation is described according to a source-gate erase method, the erase operation may be carried out according to a gate-substrate erase method. In the case of a gate-substrate erase method, source potential generating circuit 220 sets the source line SL at an electrically floating state to apply power supply voltage Vcc to the substrate of the memory cell at the time of erasure. This substrate voltage supplying circuit is normally provided independently of source potential generating circuit 220.

In general, a data program operation is carried out after an erase operation. In this case, negative voltage generating circuit 218 is set to an inactive state. Source potential generating circuit 220 sets the source line SL to the level of ground potential GND. Program circuit 224 generates a high voltage of approximately 6 when the program data from input/output buffer 226 is "0". Vpp/Vcc generating circuit 216 generates a high voltage Vpp, which is supplied to word line driver 206 (this signal transmission path is not shown). In data programming, X decoder 204 and Y decoder 208 both execute a decoding operation. A high voltage Vpp is applied on a selected word line, and a relatively high voltage from program circuit 224 is generated onto the selected bit line. As a result, data "0" is written into the memory cell. In a memory cell to which data "1" is to be written, the potential of the corresponding bit line is 0 V which is a level where injection of electrons to a floating gate is not normally carried out and an erased state is maintained. The erased state corresponds to data "1".

In data read out operation, program/erase control signal 214 responds to a signal OE to inhibit the high voltage generation operation of Vpp/Vcc generating circuit 216. Vpp/Vcc generating circuit 216 generates power supply voltage Vcc in this case. Similarly, negative voltage generating circuit 218 is made inactive. Source potential generating circuit 220 connects the source line SL to ground potential GND. Under such a state, the selection operation of memory cells is executed according to an address signal latched in address latch 202, whereby a signal of power supply voltage level Vcc is transmitted to the selected word line via word line driver 206. A low read out voltage (approximately 1-2 V) from the read out voltage generating circuit in sense amplifier 222 is applied to the bit line BL. Sense amplifier 222 detects a flow of current to generate and provide to input/output buffer 226 data.

In the foregoing, program/erase control circuit 214 is described to determine the operation timings of address latch 202, Y decoder 208, and X decoder 204 at the time of data read out. As an alternative, program/erase control circuit 214 may not carry out any control operation, and address latch 202, X decoder 204, and Y decoder 208 may carry out static processings of applied signals.

FIG. 9 specifically shows a structure of the Vpp/Vcc generating circuit shown in FIG. 8. Referring to FIG. 9, the Vpp/Vcc generating circuit includes a ring oscillator 802 activated in response to a control signal $\Phi 1$ for carrying out an oscillation operation at a predetermined cycle, a charge pump 804 for carrying out a charge pump operation according to an oscillation signal from ring oscillator 802 to generate a predetermined high voltage Vpp, and a selection circuit 806 for selecting and providing either a high voltage Vpp from charge pump 804 or a power supply voltage Vcc Ring oscillator 802 is normally implemented by inverter circuits of an odd number of stages. The oscillation period of ring oscillator 802 is determined by the number of the stages of the inverter circuits and the delay time in each inverter circuit. Charge pump 804 includes a capacitor and a diode. By a charge injection operation by the capacitance coupling of the capacitor, a high voltage Vpp of a predetermined level (for example 12 V) is generated from power supply voltage Vcc.

Selection circuit 806 includes a p channel MOS (insulation gate type) transistor 810 responsive to a control signal $\Phi A$ to pass high voltage from charge pump 804, a p channel MOS transistor 814 responsive to a control signal $\Phi B$ to pass power supply voltage Vcc, and an n channel MOS transistor 812 provided between transistors 810 and 814 for receiving power supply voltage Vcc at its gate. Voltage Vpp/Vcc of a predetermined level is generated from the connection node of transistors 810 and 812. "Vpp/Vcc" indicates either high voltage Vpp or power supply voltage Vcc.

Control signals $\Phi 1$, $\Phi A$ and $\Phi B$ are generated from program/erase control circuit 214 shown in FIG. 8. In a programming operation mode requiring provision of high voltage to the control gate of a memory cell, control signal $\Phi A$ attains a L level (logical low), whereby high voltage Vpp is selected from charge pump 804. In an erase operation and in normal data read out operation, the control signal $\Phi B$ attains a L level, whereby power supply voltage Vcc is selected. In this erase operation mode and normal read out operation mode, the control signal $\Phi 1$ becomes inactive so that ring oscillator 302 does not carry out an oscillation operation. The output of charge pump 804 is set to the level of ground potential GND or power supply voltage Vcc. Under such a state, the control signal $\Phi A$ attains a H level (logical high) to turn off transistor 810.

Transistor 812 receives power supply voltage Vcc at its gate to function as a protective resistance element to prevent high voltage Vpp through transistor 810 from being applied to transistor 814. The control signal $\Phi B$ attains a H level in a programing operation mode to turn off transistor 814. Here, a H level indicates the power supply voltage Vcc level.

FIG. 10 shows an example of a structure of the X decoder and the word line driver shown in FIG. 8. Referring to FIG. 10, X decoder 204 includes a unit decoder circuit 250 provided corresponding to each word line. This unit decoder circuit 250 includes a structure of an NAND circuit to provide a L signal of 0 V level when attaining a selected state.

Word line driver 206 includes a Vpp switch 252 and a negative voltage switch 254 provided corresponding to unit decoder circuit 250. Vpp switch 252 provides a signal of the level of voltage Vpp/Vcc when the output of unit decoder circuit 250 is "L" indicating a selected state. When the output of unit decoder circuit 250 is H (power supply voltage Vcc level) indicating a non-selected state, Vpp switch 252 provides a signal of ground potential level GND.

In an erase operation mode, negative voltage switch 254 provides a signal of power supply voltage level Vcc (5 V) when the output of unit decoder circuit 250 attains a L level indicating a selected state, and provides a negative voltage Vng of a predetermined level, for example −10 V, when the output of unit decoder circuit 250 attains a H level indicating a non-selected state. In normal data read out mode and programming mode, negative voltage Vng is not generated, and is set to the level of ground potential GND.

Word line driver 206 further includes an n channel MOS transistor 256 responsive to an erase mode designating signal /ΦE for transmitting an output of unit decoder circuit 250 to Vpp switch 252, a p channel MOS transistor 258 responsive to a signal ΦE for transmitting the output of Vpp switch 252 to a word line WL, an n channel MOS transistor 260 responsive to a signal ΦE for transmitting the output of unit decoder circuit 250, an inverter circuit 262 for inverting and transmitting to negative voltage switch 254 a signal transmitted from transistor 260, an n channel MOS transistor 264 responsive to a signal ΦE for transmitting an output of negative voltage switch 254, an n channel MOS transistor 266 responsive to an output of transistor 264 for transmitting negative voltage Vng to a word line WL, and an n channel MOS transistor 265 responsive to a signal /ΦE for connecting the gate of transistor 266 to ground potential GND.

The erase mode designating signal ΦE attains a H level of power supply voltage Vcc in erase operation mode. The signal ΦE is set to the level of ground potential GND in operations other than the erase mode operation, i.e. in normal data read out mode and programming mode. The signal /ΦE is a complementary signal of the erase mode designating signal ΦE. The signal /ΦE attains a level of ground potential GND in an erase mode operation, and a level of power supply voltage Vcc in other operation modes.

Word line driver 206 further includes an inverter circuit 272 receiving an output of unit decoder circuit 250, a p channel MOS transistor 268 for receiving an output of inverter circuit 272 at its gate, and an n channel MOS transistor 270 for receiving an output of unit decoder circuit 250 at its gate. Transistors 268 and 270 are provided in series between the word line WL and ground potential GND. When the output of unit decoder circuit 250 attains a H level and a corresponding word line WL attains an non-selected state, transistors 268 and 270 are turned on simultaneously, whereby the potential of the word line WL is set to the level of ground potential GND. When the corresponding word line WL attains a selected state, transistors 268 and 270 are both turned off. In this case, the gate voltage of transistor 268 attains the level of power supply voltage Vcc and transistor 268 is turned off even if a negative voltage Vng is transmitted to the word line WL because p channel MOS transistor 268 is coupled to the word line WL. This reliably prevents the negative voltage on the word line WL from being coupled to ground potential GND. The operation thereof will be described hereinafter.

In an erase operation mode, the signal ΦE attains a H level of power supply potential Vcc, and the signal /ΦE attains a L level of ground potential GND. In this case, the output of unit decoder circuit 250 is transmitted to negative voltage switch 254. Negative voltage switch 254 provides an H signal of power supply voltage Vcc when the output of inverter circuit 262 attains a H level (the level of the power supply potential Vcc). This turns on transistor 266, whereby a negative voltage Vng is transmitted on the word line WL. Here, transistors 268 and 270 are both turned off because the output of inverter circuit 272 attains a H level of power supply voltage Vcc and the output of unit decoder circuit 250 attains a L level of ground potential GND. Thus, the potential of the selected word line WL is reliably set to the level of negative voltage Vng.

When the output of unit decoder circuit 250 attains a H level (power supply voltage Vcc), the outputs of inverter circuits 262 and 272 both attain a L level (ground potential GND). In this case, negative voltage switch 254 generates a negative voltage Vng which is supplied to the gate of transistor 266. Transistor 266 is turned off because the potential between the gate and the source is identical, so that the negative voltage Vng is not transmitted to the word line WL. Here, transistors 268 and 270 both are turned on, whereby the potential of word line WL is set to the level of ground potential GND.

In data read out mode and programming mode operation, the signal ΦE attains a L level of ground potential GND, and the signal /ΦE attains a H level of power supply voltage Vcc. As a result, the output of unit decoder circuit 250 is transmitted to Vpp switch 252. Transistor 265 responds to the signal /ΦE to conduct, whereby the gate potential of transistor 266 is fixed to the level of ground potential GND. In this case, the negative voltage Vng is not generated (is at GND level). Thus, transistor 266 is reliably turned off.

Vpp switch 252 generates a signal of voltage Vpp/Vcc level when the output of unitary decoder circuit 250 attains a L level (ground potential GND). p channel MOS transistor 258 receives a signal of ground potential GND at its gate. As a result, the voltage Vpp/Vcc from Vpp switch 252 is transmitted to the word line WL, whereby the potential of the word line WL rises to the level of Vpp/Vcc. Here, the output of inverter circuit 272 attains a H level (power supply voltage Vcc), and p channel MOS transistor 268 is turned on when the potential of the word line WL attains a level of high voltage Vpp. Because n channel MOS transistor 270 receives a signal of ground potential GND at its gate also in this case, n channel MOS transistor 270 is reliably turned off, whereby the level of potential Vpp of the word line WL is reliably maintained.

When the output of unit decoder circuit 250 attains a H level, Vpp switch 252 provides a signal of ground potential GND. In this case, p channel MOS transistor 258 is turned off. Transistor 268 and 270 are both turned on, whereby the potential of the word line WL is fixed to the level of ground potential GND. The structures of the negative voltage switch and the Vpp switch will be described hereinafter.

FIG. 11 specifically shows a structure of a Vpp switch. Referring to FIG. 11, a Vpp switch 252 includes inverter circuits 70 and 72 cascade-connected in two stages for receiving an input signal IN, and an n channel MOS transistor 74 for passing the output of inverter circuit 72. Power supply voltage Vcc is applied to the gate of transistor 74. Transistor 74 has a protective resistance function according to the characteristics of a MOS transistor passing only a voltage of a gate voltage less the threshold voltage.

Vpp switch 252 further includes a p channel MOS transistor 76 and an n channel MOS transistor 78 connected in a complementary manner for receiving an output of inverter circuit 72 at its respective gates via transistor 74. p channel MOS transistor 76 receives voltage Vpp/Vcc at its source. n channel MOS transistor 78 has its source connected to ground potential GND. Vpp switch 252 further includes a p channel MOS transistor 80 for receiving an output signal OUT at its gate to transmit voltage Vpp/Vcc to the gates of transistors 76 and 78. The operation thereof will be described hereinafter.

When an input signal IN attains a H level of 5 V, transistor 78 is turned off, and transistor 76 is reduced in conductance. As a result, the output signal OUT is discharged by transistor 78, whereby the potential level thereof is reduced. In accordance with reduction of the potential level of the output signal OUT, transistor 80 goes to an ON state to charge the gates of transistors 76 and 78 to the level of voltage Vpp/Vcc. When the gates of transistors 76 and 78 attain the voltage level of Vpp/Vcc, transistor 76 is completely turned off, whereby the output signal OUT attains a L level of 0 V. Even if the gates of transistors 76 and 78 attain a level of high voltage Vpp, this high voltage Vpp will not be transmitted to the output portion of inverter circuit 72 on account of the decoupling function of transistor 74. Thus, stability of the circuitry can be achieved.

When the input signal IN attains a L level of 0 V, transistor 76 is turned on and transistor 78 is turned off. As a result, the output signal OUT is raised to the level of Vpp/Vcc. In accordance with the rise of the output signal OUT, transistor 80 is turned off. The determination of which of voltages Vpp and Vcc is applied is made depending on the operation mode. High voltage Vpp is applied in a program mode operation, and voltage Vcc is applied in a normal data readout mode operation.

FIG. 12 specifically shows a structure of a negative voltage switch 254. The structure of this negative voltage switch shown in FIG. 12 is described in ISSCC 92 SLIDE SUPPLEMENT, pp. 114–115, for example. Referring to FIG. 12, a negative voltage switch 254 includes an inverter circuit 1 for receiving an input signal IN, a p channel MOS transistor 2 for receiving the output of inverter circuit 1 by its gate for charging an output signal line 8 to the level of power supply voltage Vcc, a depletion type P channel MOS transistor 3 having its gate connected to a node N100 and its source connected to output signal line 8, and an n channel MOS transistor 4 having its gate receiving the output of inverter circuit 1, its drain connected to the drain of transistor 3, and its source connected to the level of ground potential GND. The substrate of depletion type p channel MOS transistor 3 and p channel MOS transistor 2 are coupled to power supply voltage Vcc. Transistor 3 is turned on at the time of normal operation to function as a load resistor.

Negative voltage switch 254 further includes a p channel MOS transistor 5 responsive to the potential on output signal line 8 for charging node N10 to the level of the voltage applied to node N102, an n channel MOS transistor 6 responsive to a signal on output signal line 8 for discharging node n10 towards the level of negative voltage Vng, and an n channel MOS transistor 7 responsive to the potential on node N10 for charging output signal line 8 towards the level of negative voltage Vng. The operation thereof will be described hereinafter. In the following description, it is assumed that the power supply voltage Vcc is 5 V, the negative voltage Vng is −10 V, and the ground potential GND is 0 V.

In an erase mode operation, 5 V is applied to nodes N100 and N102. When the input signal IN attains a level of 5 V (when the output of inverter circuit 262 attains a H level in FIG. 10), the output of inverter circuit 1 becomes 0 V. This causes transistor 2 to be turned on and transistor 4 to be turned off, whereby output signal line 8 is discharged to 5 V of the power supply voltage Vcc level. In accordance with the rise of the potential of the output signal line 8, transistor 5 is turned off and transistor 6 is turned on. In response to turn on of transistor 6, node N10 is discharged towards negative voltage Vng, and transistor 7 changes to an OFF state. As a result, output signal line 8 is maintained at 5 V, whereby the output signal OUT attains a H level of 5 V.

When the input signal IN attains a level of 0 V (when the output of decoder circuit 250 attains a H level in FIG. 10), the output of inverter circuit 1 becomes 5 V. Under such a state, transistor 2 is turned off and transistor 4 is turned on. Transistor 3 is slightly turned on by the potential of node N100 attaining a level of 5 V. This causes the output OUT on output signal line 8 to be discharged to 0 V. In this case, output signal OUT gradually decreases in level on account of the function of the load resistance of depletion type transistor 3. In accordance with reduction of the potential level of the output signal OUT, transistor 5 gradually attains an ON state, whereby transistor 6 is reduced in conductance (due to the reduced potential difference between the gate and source of transistor 6). As a result, node N10 is charged via transistor 5, whereby the potential of node N10 rises gradually. In response to the potential level of node N10 gradually rising from −10 V, transistor 7 is gradually turned on, whereby the potential of output signal 8 is discharged towards negative voltage Vng (−10 V). The reduction of the potential level of output signal OUT on output signal line 8 is fed back to the gates of transistors 5 and 6. The potential level of node N10 eventually rises to the level of 5 V, whereby transistor 7 is completely turned on, and the output signal OUT eventually takes a level of −10 V.

Transistor 3 is turned off when the output signal OUT attains the level of approximately 0 V to 1 V, depending upon the threshold voltage. More specifically, the output signal OUT is initially discharged to the level of 0 V by transistors 3 and 4. As the level of the output signal OUT is further reduced, discharge is continued via transistor 7, and the signal OUT eventually attains the level of the negative voltage (−10 V). Because transistors 3 and 4 are turned off under this state, the output signal OUT is maintained at the level of −10 V.

More specifically, the negative voltage switch 254 shown in FIG. 12 generates an output signal OUT of 5 V when the input signal IN attains the level of 5 V, and generates an output signal of −10 V when the input signal IN attains the level of 0 V.

In a normal data read out mode operation and a program mode operation, the negative voltage switch having the structure shown in FIG. 12 will not function. A voltage of 0 V is applied to nodes N100 and N102, and the negative voltage Vng is set to 0 V (the operation of the negative voltage generating circuit is suppressed).

In such a state, transistor 3 is deeply turned on. The conductance thereof is great. Transistors 5, 6 and 7 do not function because the potential of node N102 is 0 V. When the input signal IN attains the level of 5 V, output signal line 8 is charged via transistor 2, whereby the output signal OUT attains the level of 5 V. When the input signal IN attains the level of 0 V, transistor 4 is turned on, and output signal line 8 is discharged towards ground potential GND. As a result, the output signal OUT attains a level of 0 V. In other words, this circuit functions as a buffer circuit.

In accordance with the above-described negative gate voltage method in which a negative voltage is applied to the control gate, an on-chip boosting circuit (or a charge pump circuit) can be used to realize a flash memory that can operate with an external 5 V unitary power source.

However, because the negative voltage switch generates a voltage of 5 V and −10 V as shown in FIG. 12, a voltage as high as 15 V is applied between the source and drain of some transistors. For example, when the input IN attains a level of 0 V, inverter circuit 1 has an output of 5 V which is provided to the gate of transistor 2 in FIG. 12, for example. Under such a state, transistor 2 is turned off, but the output signal OUT is −10 V. Therefore, a voltage of 15 V is applied between the source and drain of transistor 2.

Transistors are reduced in size as the storage capacity of a flash memory is increased. When a high voltage is applied to a scaled-down transistor, various problems occur such as avalanche due to concentrated electric field between the drain and gate, damage of the gate insulating film, and generation of punch through. That is to say, the breakdown voltage of a transistor is reduced as its size is reduced. Therefore, there is a problem that the negative voltage switch can not be operated in a stable manner when scaling down is advanced in a flash memory of a large capacity.

This problem of the breakdown voltage in a transistor is also seen in the Vpp switch shown in FIG. 11 (high voltage Vpp is approximately 12 V).

SUMMARY OF THE INVENTION

An object of the present invention is to provide a voltage generating circuit that can generate a desired voltage stably even when scaling down is advanced.

Another object of the present invention is to provide a voltage generating circuit of high reliability in which high voltage is not applied between the source and drain of a transistor.

An internal voltage generator according to the present invention includes an output stage employing the voltages on first and second power supply lines as operating power supply voltages and producing an output signal with the level of the voltage on the first or the second power supply line in accordance with an input signal, and circuitry for adjusting the voltage level on the second power supply line such that the difference between the voltages on the first and second power supply lines when the voltage on the first supply line is detected to attain a first level.

Since the voltage difference of the first and second power supply lines is made small when the voltage on the first power supply line attains the first level, the voltage applied across a transistor in the output circuit stage is relaxed, so that the breakdown of the transistor can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 13:
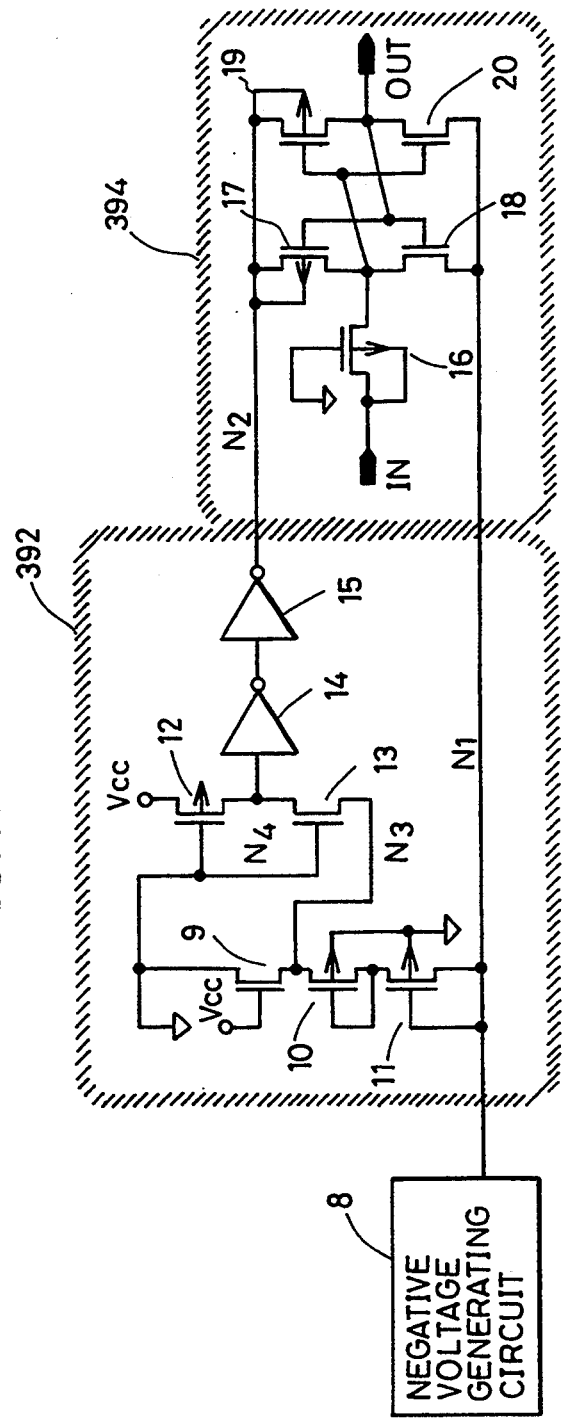
FIG. 13 shows a structure of a voltage generating circuit according to a first embodiment of the present invention.

FIG. 13 shows a structure of a voltage generating circuit according to a first embodiment of the present invention. Referring to FIG. 13, a voltage generating circuit includes a voltage detection circuit 392 for detecting the voltage level on a node N1, and a voltage conversion circuit 394 operating with the voltage on a node N2 to which the output of voltage detection circuit 392 is provided and the voltage on node N1 as the operating power supply voltages. Node N1 is the first power supply line through which the voltage generated by negative voltage generating circuit 8 is transmitted. Node N2 is a second power supply line. Voltage conversion circuit 394 provides an output signal OUT according to an input signal IN.

Voltage detection circuit 392 includes an n channel MOS transistor 9 receiving a power supply voltage Vcc at its gate and transmitting ground potential GND to a node N3, and resistor-connected p channel NOS transistors 10 and 11 provided between nodes N3 and N1. The substrate of transistors 10 and 11 is connected to ground potential GND. Transistors 10 and 11 have a relatively high resistance.

Voltage detection circuit 392 further includes a p channel MOS transistor 12 responsive to ground potential GND received at its gate for transmitting the power supply voltage Vcc to a node N4, an n channel MOS transistor 13 responsive to ground potential GND received at its gate for electrically connecting nodes N4 and N3, and 2-stage cascade-connected inverter circuits 14 and 15 for amplifying the potential on node N4.

Voltage conversion circuit 394 serving as an output stage includes a p channel MOS transistor 16 responsive to ground potential GND received at its gate for passing an input signal IN, a p channel MOS transistor 17 and an n channel MOS transistor 18 connected in a complementary manner between nodes N2 and N1, and a p channel MOS transistor 19 and an n channel MOS transistor 20 connected in a complementary manner between nodes N2 and N1. Transistors 17, 18, 19 and 20 form a inverter latch circuit. An output signal OUT is provided from the connection node of transistor 19 and transistor 20. Negative voltage generating circuit 8 provides a signal of ground potential level GND in an inactive state, and a predetermined negative voltage of approximately −10 V when in an active state. The operation of the voltage generating circuit shown in FIG. 13 will be described hereinafter with reference to an operation waveform diagram of FIG. 14.

Prior to a time T0, negative voltage generating circuit 8 attains an inactive state and supplies a voltage of 0 V to node N1. Transistor 9 receives the power supply voltage Vcc at its gate and is turned on to transmit a voltage of 0 V to node N3. Under such a state, transistors 10 and 11 are turned off. Because a voltage of 0 V is provided to the inverter circuit formed of transistors 12 and 13, node N4 is charged by transistor 12 to attain a level of 5 V which is the power supply voltage Vcc. The voltage on node N4 is supplied to node N2 via inverter circuits 14 and 15. Therefore, the potential of node N2 takes the level of 5 V which is the power supply voltage Vcc under this state.

When the input signal IN is 0 V, transistors 19 and 20 are turned on and off, respectively, whereby the output signal OUT attains the voltage level on node N2, i.e. the H level of the power supply voltage Vcc of 5 V.

When the input signal IN is 5 V, transistors 19 and 20 are turned off and on, respectively, whereby the output signal OUT attains the voltage level on node N1, i.e. the L level of 0 V.

When the input signal IN is 0 V, transistor 16 transmits a voltage higher by the absolute value of the threshold voltage ($|Vthp|$). However, this voltage is sufficient of a level in which the latched states of transistors 17, 18, 19 and 20 can be inverted. Thus, there is no particular problem. When negative voltage generating circuit 8 is in an inactive state, an output signal OUT of 5 V and 0 V is provided when the input signal IN is 0 V and 5 V, respectively.

At time T0, negative voltage generating circuit 8 is activated. Node N1 responds to the negative voltage transmitted from negative voltage generating circuit 8 to be gradually reduced in voltage level to eventually attain −10 V. The latched state of the input signal IN is maintained.

At a time T1 when a predetermined time period elapses since the potential of node N1 begins to fall, the voltage level of node N1 reaches a predetermined voltage level, for example −5 V. Transistors 10 and 11 are both turned on, whereby the potential of node N3 is reduced. Here, the resistances of transistors 10 and 11 are set to a sufficiently great value, and the current supplying capability of transistor 12 is set to a low value. When the potential of node N3 is reduced on account of transistors 10 and 11 turning on, transistor 13 attains an on state. Transistor 13 receives ground potential GND at its gate. Transistor 9 has a low current supplying capability and a relatively high resistance. Therefore, the potential of node N3 is reduced in response to the reduction of the potential of node N1. The potential of node N3 becomes lower than 0 V—(the threshold voltage of transistor 13).

Transistors 9 and 12 are set to be sufficiently smaller than transistor 13 in size (for the purpose of reducing current supplying capability). Therefore, the potential of node N4 is reduced by the discharge of transistor 13, and the potential of node N2 becomes 0 V by inverter circuits 14 and 15. More specifically, the potential of node N2 is set to 0 V at time T1 when the potential of node N4 becomes lower than the input threshold value of inverter circuit 14. The area between the source and substrate attains a reversed-biased state to exhibit a substrate modulation effect in response to the potential of node N1 decreasing to a negative voltage, resulting in an increase in the resistance of transistors 10 and 11 having the substrate coupled to ground potential GND. This prevents a great amount of current from flowing towards node N1 from power supply voltage Vcc via transistors 12, 13, 10 and 11. Also, transistor 9 functions as a load resistor to prevent current from flowing to node N1 from ground potential via transistors 9, 10 and 11. Node N1 is eventually set to the negative voltage of −10 V reliably by negative voltage generating circuit 8.

At time T1 when the potential of node N1 becomes −5 V, voltage conversion circuit 394 maintains the previously latched information because the potential difference between node N1 and node N2 is sufficient.

The threshold voltages of transistors 10 and 11, the size of transistors 12, 13 and 9, and the threshold value of inverter circuit 14 are selected so that the potential of node N2 can attain the level of 0 V when the potential of node N1 falls to the level of approximately −5 V at time T1.

A structure may be employed in which the potential of node N3 is, without an effect of the source clamp function of transistor 13, reduced in response to reduction of the potential of node N1. In this case, the potential of node N4 is reduced lower than 0 V.

Under such a state, the output signal OUT attains the potential of node N2, i.e. 0 V, and the potential on node N1, i.e. −10 V, when the input signal IN is 0 V and 5 V, respectively. Therefore, the output signal OUT provided from voltage conversion circuit 394 can take the level of either 0 V or −10 V by latching the level of the input signal IN by transistors 17, 18, 19 and 20.

When 5 V is applied as the input signal IN, transistor 17 is turned on whereby current flows to node N2. It is therefore necessary to set the input signal IN to 0 V after the time of T1. It is preferable to set the input signal IN to an electrically floating state of 0 V so that the latched state is not inverted.

In the structure shown in FIG. 13, when transistor 13 lacks the source clamp function, the potential of node N3 is prevented from falling below −5 V by the resistance of transistors 10 and 11 (providing a potential difference of 5 V) even when the potential of node N1 becomes −10 V, whereby the potential level of node N4 similarly does not fall below 5 V. As a result, a potential difference greater than 10 V will not be applied across the source and drain of transistor 12.

Figure 15:
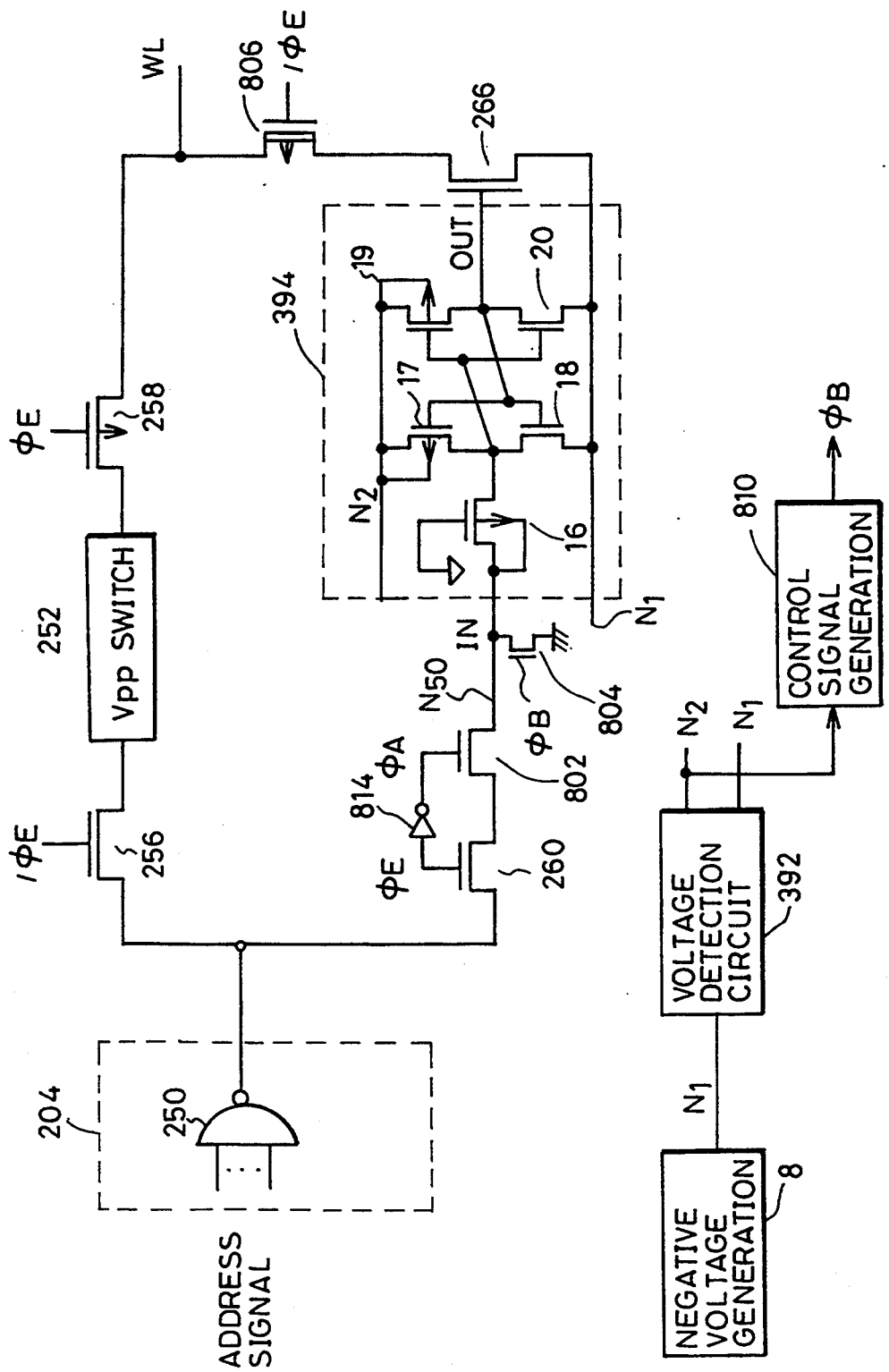
FIGS. 15, 16A, 16B, and 17 show a structure of the word line driver portion formed according to the concept of the present invention.

FIG. 15 shows a structure of a word line driver portion according to the present invention. Referring to FIG. 15, a word line drive circuit includes a transfer gate 260 conducting in response to an erase mode designating signal ΦE, a transfer gate 802 responsive to a delayed inversion signal ΦA of signal ΦE to attain a nonconductive state, a reset transistor 104 responsive to a control signal ΦB to attain a conductive state, a voltage conversion circuit 394 for generating an output signal OUT according to an signal IN on an input node N50, a transfer gate 266 responsive to an output signal OUT of voltage conversion circuit 394 for transmitting the voltage on node N1, and a normally-on depletion type transistor 806 provided between transfer gate 266 and a word line WL.

Reset transistor 804 becomes conductive in response to a control signal ΦB to reset input node N50 to "0" (a L level). Control signal generating circuit 810 responds to the fall of the potential on node N2 to set control signal ΦB to an active state (a H level) for a predetermined time period.

Transfer gate control signal ΦA is generated by inverting and delaying erase mode designating signal ΦE by inverter circuit 814. Therefore, transistor 802 will attain a non-conductive state-at the time of negative voltage generation (erase operation). Transfer gate 802 attains a non-conductive state after the latch of the input signal IN by voltage conversion circuit 394.

Transistor 806 transmits the voltage from transfer gate 266 onto the word line WL in erase operation mode. In programming operation mode, signal /ΦE attains the level of power supply voltage Vcc and transistor 806 attains a high resistive state, whereby a program high voltage Vpp is prevented from being applied to transfer gate 266. The absolute value of the threshold voltage of transistor 266 is set to be as low as possible.

The operation thereof will be described hereinafter.

When the output of unit decoder circuit 250 attains a selected state of 0 V, a voltage of 0 V is transmitted to the gates of transistors 19 and 20 via transistor 16, whereby transistors 19 and 20 attain an on and off state, respectively. The output signal OUT attains the voltage level on node N2. This output signal OUT is supplied to the gates of transistors 17 and 18 to be latched by transistors 17, 18, 19 and 20.

Then, in response to control signal ΦE, negative voltage generating circuit 8 is activated, whereby the potential of node N1 is reduced. Before the potential of node N1 reaches −5 V, for example, the control signal ΦA falls to a L level, whereby transfer gate 802 attains a non-conductive state and node N50 attains an electrically floating state of 0 V.

When the potential of node N1 becomes −5 V (refer to FIG. 14, time T1), a control signal ΦB is generated, whereby transistor 804 conducts and node N50 is reset to 0 V. When transistor 804 becomes non-conductive, node N50 attains an electrically floating state of 0 V.

Here, the potential of node N2 falls to 0 V from 5 V. (When the potential of node N1 is −5 V, the potential of node N2 changes to 0 V).

Figure 14:
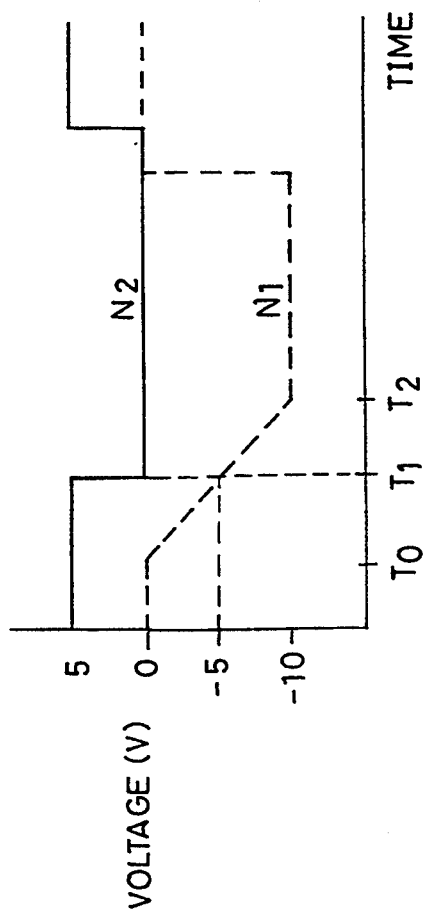
FIG. 14 is a waveform diagram showing the operation of the voltage generating circuit shown in FIG. 13.

When the output of unit decoder circuit 250 is 0 V, the output signal OUT becomes 0 V after time T1 (refer to FIG. 14). The potential of node N1 becomes a negative voltage of Vng by negative voltage generating circuit 8, and transistor 266 maintains a conductive state. As a result, a negative voltage Vng is transmitted via transistor 806 to the selected word line WL.

When the output of unit decoder circuit 250 is 5 V, the output signal OUT attains the potential level of node N1 by transistor 20. In this case, transfer gate 266 attains an off state (the potential between source and gate is the same), and the word line WL maintains the initial setting of 0 V. (Although a reset transistor is not shown, the transistors 268 and 270 of FIG. 10 may be used.)

The control signal ΦE is generated for each unit of sector or page.

When a negative voltage is transmitted to the word line WL, a high voltage is applied across the gate and drain of transistor 258. Transistor 258 may have its gate implemented to normally receive 0 V.

When an erase operation is completed, signals ΦE and ΦE become 0 V and 5 V, respectively. Transistor 256 is turned on and transistor 260 is turned off. Negative voltage generating circuit 8 attains an inactive state, and nodes N1 and N2 become 0 V and 5 V, respectively. A normal programming and read out operation is carried out by transmitting the voltage Vpp/Vcc to a selected word line by Vpp switch 252. In normal data read out operation, signals ΦE and /ΦE attain a L level and a H level, respectively, whereby Vpp switch 252 operates to carry out selection of a word line.

Figure 16A:
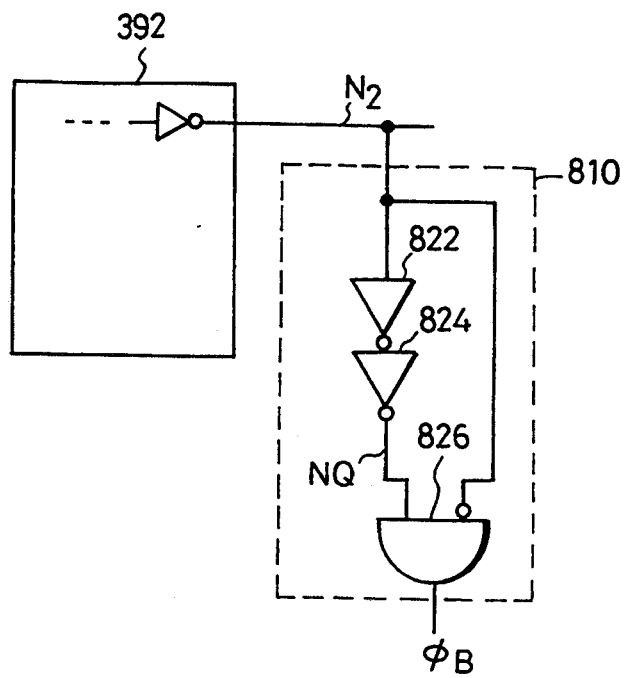

FIG. 16A shows a structure of a control signal generating circuit 810 of FIG. 15. Referring to FIG. 16A, a control signal generating circuit 810 includes two stages of cascaded inverters 822 and 824 receiving a voltage signal of node N2, and a 2-input logic gate 826 receiving the voltage signal on node N2 at its false input, and the output of inverter 820 at its true input. Logic gate 826 provides a signal of a H level only when the voltage level applied to its false input is attains a L level (0 V) and the voltage level applied to its true input attains a H level (5 V).

Figure 16B:
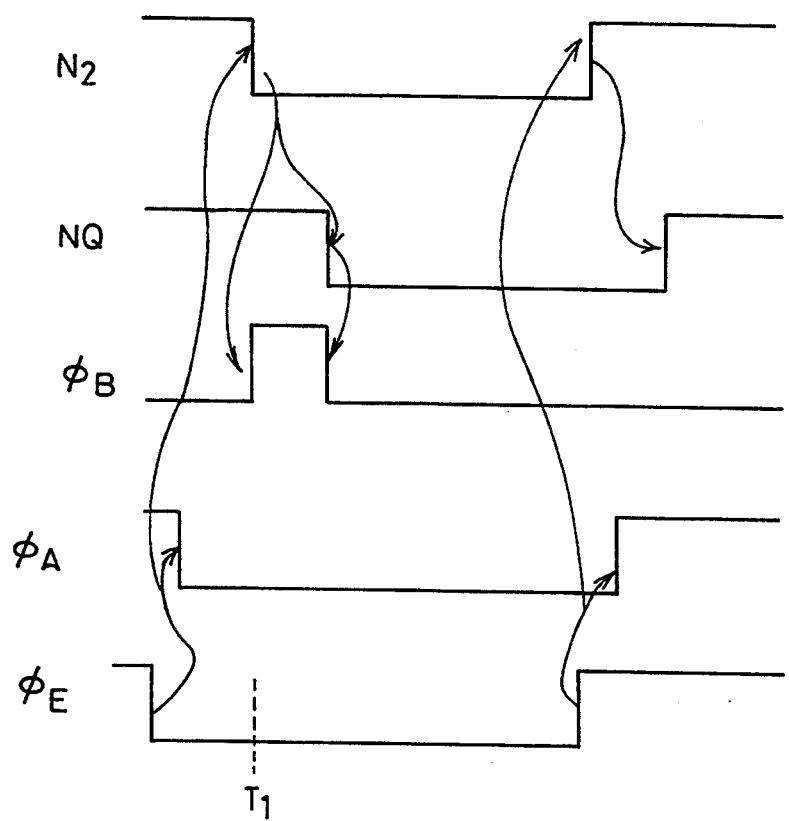

Therefore, the output ΦB of logic circuit 826 attains a level of H for a predetermined time period in response to the potential of node N2 falling from a H level (5 V) to a L level (0 V) as shown in the waveform diagram of FIG. 16B. This allows the input node of voltage conversion circuit 394 to be set to an electrically floating state of 0 V after the time of T1. The signal ΦA is generated by delaying signal ΦE. The falling timing of the signal ΦA is shown to be prior to the potential fall of node N2. The potential of node N2 may be used as the signal CA.

Figure 10:
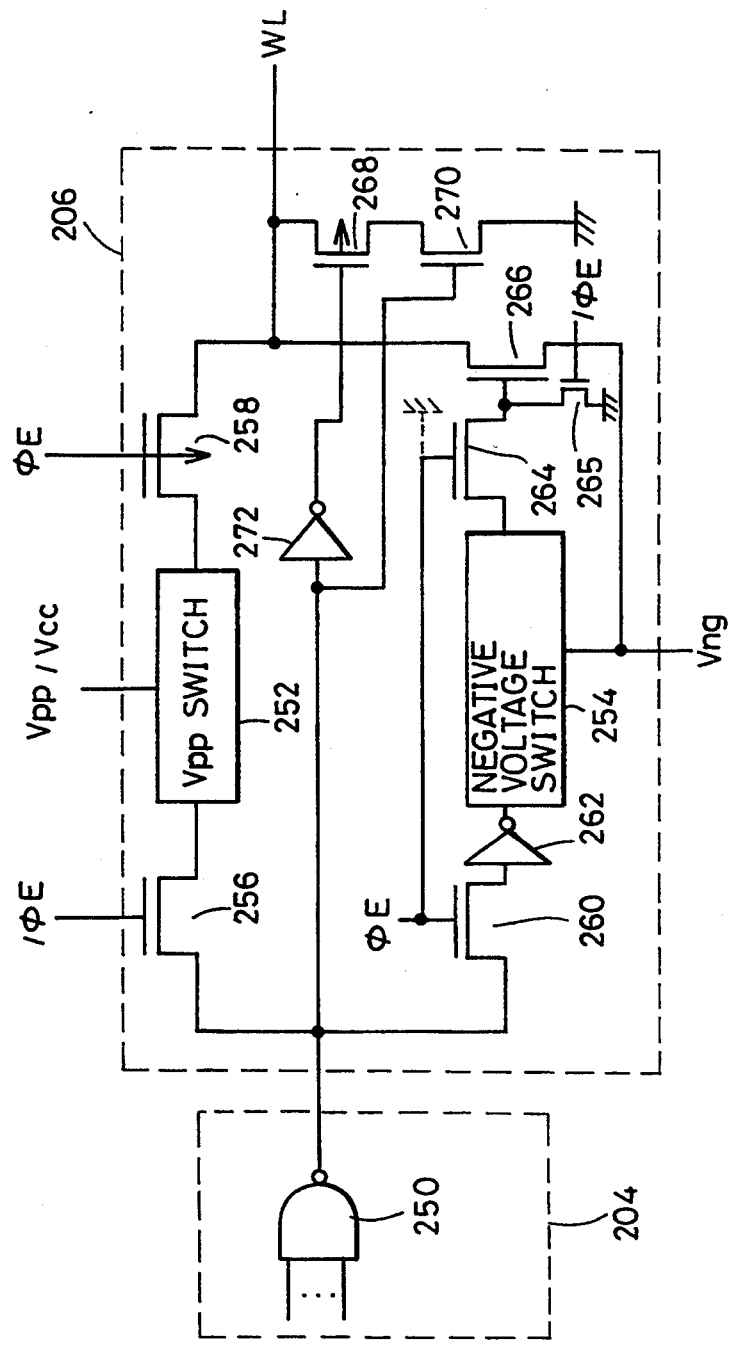
FIG. 10 is a diagram showing a structure of the X decoder and the word line driver portion shown in FIG. 8.
Figure 11:
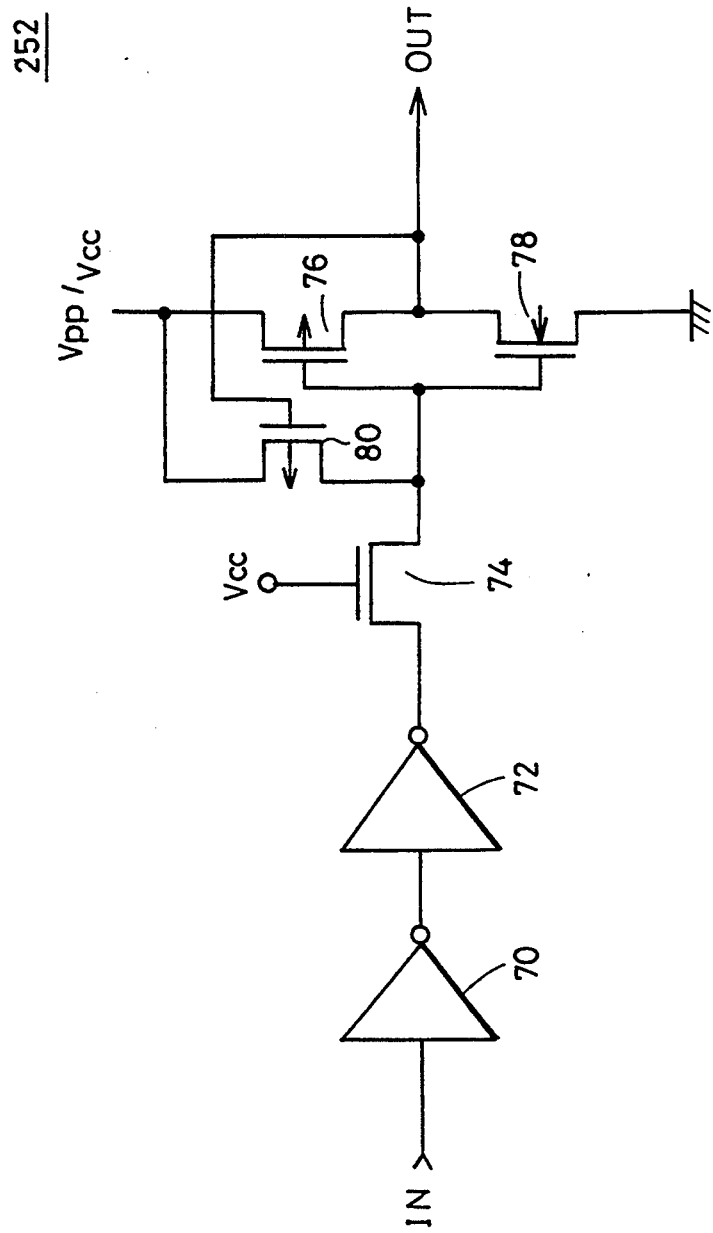
FIG. 11 shows a structure of the Vpp switch shown in FIG. 10.
Figure 12:
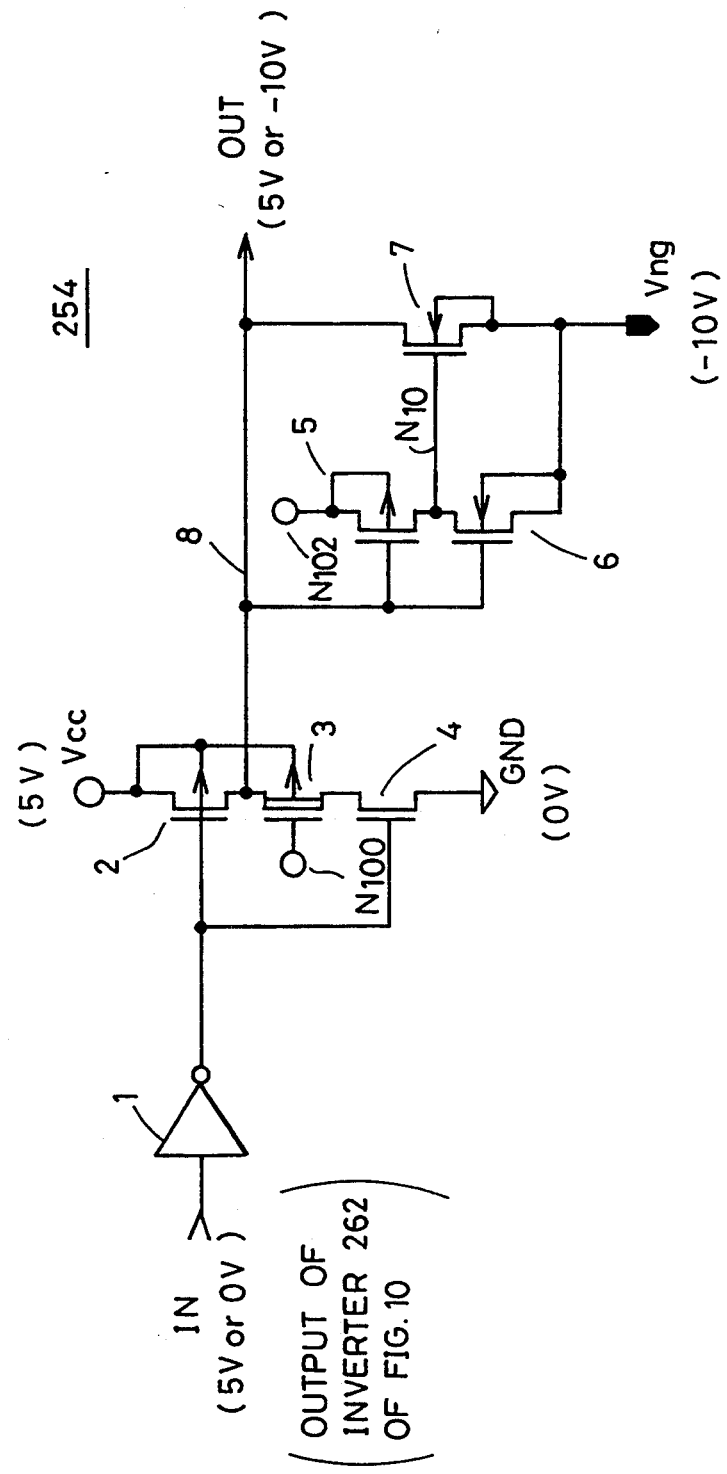
FIG. 12 is a diagram showing a structure of the negative voltage switch shown in FIG. 10.

In the structure shown in FIG. 10, the output of negative voltage switch 254 is transmitted via transistor 264. A signal of the power supply voltage level Vcc is transmitted to the gate of transistor 264. When the structure shown in FIG. 10 is used in the present application, an n channel MOS transistor can pass only the voltage of the gate voltage minus the threshold voltage. Therefore, in order to prevent the generation of a great potential difference across the gate and drain (or source) of transistor 264, the gate may be fixed to the level of ground potential GND as shown in the broken line of FIG. 10. This is because transistor 266 conducts and passes the negative voltage Vng even when the output of negative voltage switch 254 is 0 V. When the output of negative voltage switch 254 attains the level of the negative voltage Vng, transistor 264 is turned on and a negative voltage level is transmitted to the gate of transistor 266 to reliably turn off transistor 266.

In the voltage conversion circuit 394 shown in FIG. 13, the output signal OUT is gradually reduced according to the level of node N1 to eventually attains the level of −10 V when the input signal IN changes to an electrically floating state of 0 V from 5 V. At this time, the latched data of 5 V changed to 0 V as a result of the potential of node N2 falling to the level of 0 V.

Even if information of 5 V is initially latched, only a potential difference of 10 V at maximum is applied across any of transistors 17, 18 and 19 if the input signal IN attains an electrically floating state.

Embodiment 2

Figure 17:
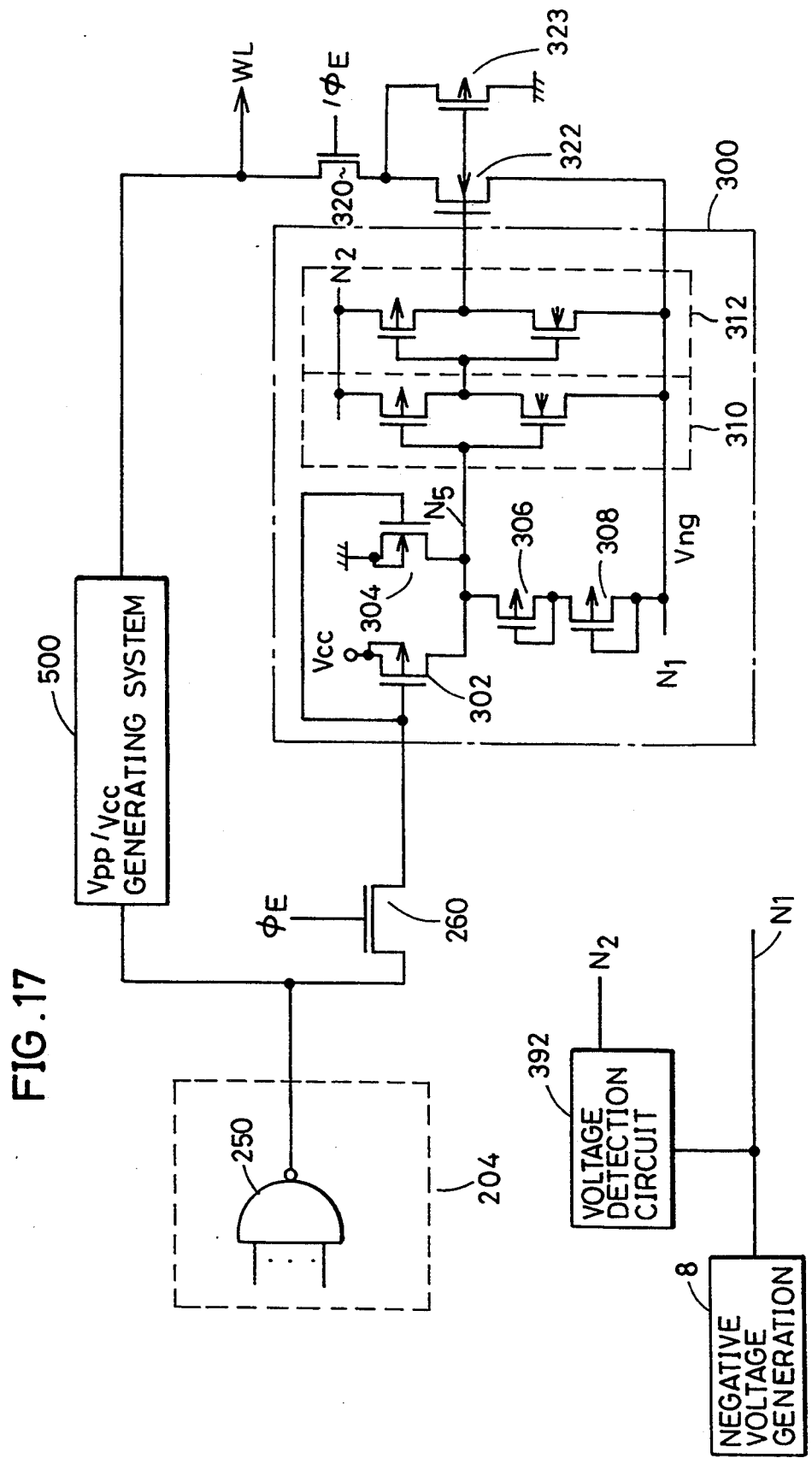

FIG. 17 shows a structure according to a second embodiment in which the negative voltage generating circuit of the present invention is applied to the word line driver portion of a flash memory. In FIG. 17, components corresponding to those shown in FIG. 10 have the same reference characters denoted. Vpp/Vcc generating circuitry 500 related to the Vpp switch in the word line driver includes transistor 256, Vpp switch 252, and transistor 258 shown in FIG. 10.

Referring to FIG. 17, a negative voltage switch 300 includes a p channel MOS transistor 302 having a source receiving the power supply voltage Vcc and a gate receiving the output of unit decoder circuit 250, an n channel MOS transistor 304 having a gate receiving the output of unit decoder circuit 250 and a source connected to ground potential GND, and resistor-connected p channel MOS transistors 306 and 308 between nodes N5 and N1. Transistors 302, 304, 306 and 308 have an on-resistance substantially of the same order. Therefore, a voltage appears on node N5 which is obtained by resistance-dividing the difference of the power supply voltage Vcc or ground potential GND and the voltage on node N1 by transistor 302 or 304 and transistors 306 and 308.

When the output of unit decoder circuit 250 attains a level of 5 V, transistors 302 and 304 are turned off and on, respectively. Under such a state, a negative voltage (for example, approximately −5 V) appears on node N5 which provides a value of resistance-division of ground potential GND and the negative voltage Vng of node N1 (erase mode operation). When the output of unit decoder circuit 250 is 0 V, transistors 302 and 304 are turned on and off, respectively. Under such a state, a voltage (for example 0 V) appears on node N5 which is a resistance-division value of the power supply voltage Vcc and the negative voltage Vng on node N1.

Negative voltage switch 300 further includes an inverter circuit 310 for receiving the voltage on node N5, and an inverter circuit 312 for receiving the output of inverter circuit 310. Inverter circuits 310 and 312 both operate with the voltage on nodes N2 and N1 as the operating power supply voltage. The input threshold value of inverter circuit 310 is set to a high value (for example −2 to −3 V when the voltage of node N1 is the negative voltage Vng). The input threshold value of inverter circuit 312 is set to a half of the difference between the voltage of node N1 and the voltage of node N2.

Word line driver 300 further includes an n channel MOS transistor 320 for receiving a signal /ΦE at its gate, and an n channel MOS transistor 322 and a p channel MOS transistor 323 receiving the output of inverter circuit 312 at its gates. Transistor 322 has its source connected to node N1, and transistor 323 has its source grounded. Transistor 320 is provided for the purpose of preventing a high voltage Vpp to be directly applied to transistors 322 and 323 when Vpp/Vcc generating circuitry 500 attains an active state and the high voltage Vpp is applied to the word line WL. The operation thereof will be described hereinafter.

When the output of unit decoder circuit 250 attains a L level of 0 V, transistors 302 and 304 are turned on and off, respectively. A voltage (approximately 0 V) appears on node N5 which is a resistance-division value of the power supply voltage Vcc and the negative voltage Vng (approximately −10 V) of node N1. The voltage value of approximately 0 V on node N5 is determined as the level of H by inverter circuit 310. Thus, the output of inverter circuit 310 approximates the level of the negative voltage Vng of node N1.

The output of inverter circuit 310 is further inverted and amplified by inverter circuit 312. Therefore, the output of inverter circuit 312 becomes the level of the voltage (approximately 0 V) on node N2. The level of the voltage of node N1 is the negative voltage of approximately −10 V, and transistor 322 is turned on to transmit this negative voltage Vng. Transistor 320 receives a control signal /ΦE at its gate. The signal /ΦE now attains the level of 0 V, and transistor 320 transmits this negative voltage to the word line WL. Here, transistor 323 is turned off because a signal of approximately 0 V on node N2 is received at the gate.

When the output of unit decoder circuit 250 attains a H level of approximately 5 V, transistors 302 and 304 are turned off and on, respectively. In this case, a negative voltage (approximately −5 V) appears on node N5 which is resistance-divided by transistors 304, 306 and 308. The voltage level on node N5 is determined as a L level by inverter circuit 310. Inverter circuit 312 inverts and amplifies the output of inverter circuit 310. Therefore, the negative voltage Vng on node N1 is provided from inverter circuit 312 via the n channel MOS transistor thereof. In response to this negative voltage Vng, transistor 322 is turned off. Conversely, p channel MOS transistor 323 is turned on to provide a level of ground potential GND. As a result, the potential of the word line WL attains ground potential GND via transistors 320 and 323.

In the structure shown in FIG. 17, only a source-drain voltage (including gate-drain voltage and gate-source voltage) of approximately 10 V in maximum is applied to any of the transistors even when a negative voltage is generated, so that sufficient breakdown voltage can be ensured for elements reduced in size.

In the structure shown in FIG. 17, p channel MOS transistor 323 has its source connected to ground potential. Additionally, an n channel MOS transistor that normally attains an ON state may be provided between transistor 323 and ground potential GND. Also, inverter circuit 272, and transistors 268 and 270 shown in FIG. 10 may be used instead of transistor 323. Furthermore, a structure may be used where node N5 is precharged to 0 V. This precharge structure disconnects transistor 306 and node N5 and grounds node N5. This precharge control signal may be a signal of 5 V/0 V.

Embodiment 3

Figure 18:
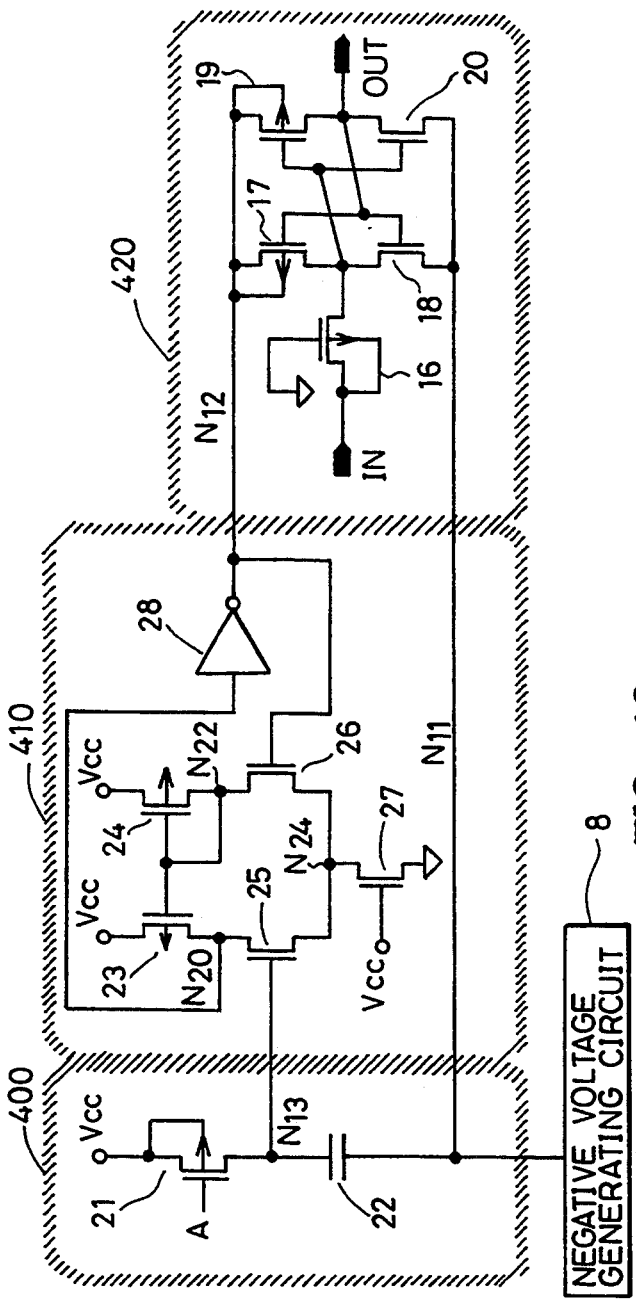
FIG. 18 is a diagram showing a structure of a voltage generating circuit according to a second embodiment of the present invention.

FIG. 18 shows a structure of a negative voltage generating circuit according to a third embodiment of the present invention. Referring to FIG. 18, a voltage generating circuit includes a node N11 to which the voltage from negative voltage generating circuit 8 is transmitted, a voltage conversion circuit 420 for operating with the voltage on nodes N12 and N11 as the operating power supply voltages, and responsive to an input signal IN to generate an output signal OUT of a voltage level on node N11 or N12, a level shift circuit 400 for shifting the voltage level on node N11, and a voltage comparison circuit 410 for comparing the output of level shift circuit 400 with the voltage of node N12 to equalize the voltage on node N12 with the output voltage level of level shift circuit 400.

Voltage conversion circuit 420 has a structure similar to the voltage conversion circuit 304 shown in FIG. 13. More specifically, voltage conversion circuit 420 includes a p channel MOS transistor 16 for passing an input signal IN, a CMOS inverter circuit formed of transistors 17 and 18, and a CMOS inverter circuit formed of transistors 19 and 20. Transistors 17, 18, 19 and 20 form an inverter latch circuit.

Level shift circuit 400 includes a p channel MOS transistor 21 conducting in response to a control signal A for charging node N13 to the level of power supply voltage Vcc, and a capacitor 22 provided between nodes N13 and N11. The signal A attains a H level during an erase mode operation where negative voltage generating circuit 8 is activated. When negative voltage generating circuit 8 is made inactive during a normal data read out mode or programming mode operation, the control circuit A is set to a L level.

Figure 19:
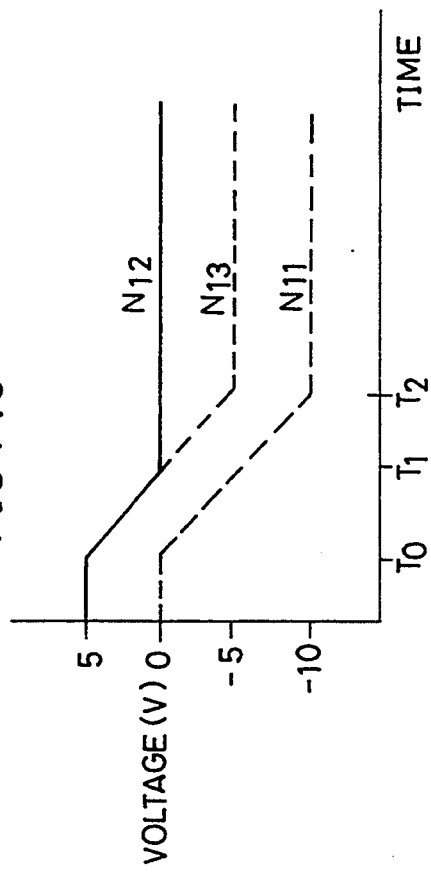
FIG. 19 is a signal waveform diagram showing the operation of the voltage generating circuit shogun in FIG. 18.

Voltage comparison circuit 410 includes a p channel MOS transistor 23 connected between the power supply voltage Vcc supplying node and a node N20, a p channel MOS transistor 24 provided between the power supply voltage Vcc supplying node and a node N22, an n channel MOS transistor 26 provided between nodes N22 and N24, an n channel MOS transistor 25 provided between nodes N20 and N24, and an n channel MOS transistor 27 provided between node N24 and ground potential GND. Transistors 23 and 24 both have their gates connected to node N22 to form a current mirror circuit. Transistor 25 receives an output signal of level shift circuit 400. Transistor 26 receives the output of inverter circuit 28. Inverter circuit 28 inverts and amplifies the voltage signal of node N20. Transistor 27 receives the power supply voltage Vcc at its gate and is normally turned on. The operation thereof will be described hereinafter with reference to the operation waveform diagram of FIG. 19.

When negative voltage generating circuit 8 attains an inactive state before time T0, i.e. in a normal data read out mode or program mode operation, the control signal A attains a L level. Node N11 attains the potential ground potential GND of approximately 0 V. Under such a state, transistor 21 is turned on and node N13 is charged to the level of the power supply voltage Vcc.

Voltage comparison circuit 410 compares the voltage of node N13 with the voltage of node N12. When the voltage of node N13 is higher than that of node N12, the conductance of transistor 25 becomes greater than that of transistor 26, whereby the potential of node N20 is slightly reduced. This reduced potential of node N20 is inverted and amplified by inverter circuit 28 to by fed back to the gate of transistor 26. This causes the gate potential of transistor 26 to rise, whereby the potential of node N22 is reduced. The gate potential of transistors 23 and 24 fall, and the potential of node N20 rises. By such an operation, the potential between nodes N20 and N22 become equal, i.e. the voltage of node N13 is equalized to the voltage of node N12.

In voltage conversion circuit 420, an input signal IN is latched in advance in the latch circuit of transistors 17, 18, 19 and 20. When the latched data is 5 V, the output signal OUT will attain the level of ground potential GND on node N11. When the latched data is 0 V, the output signal OUT attains the level of the power supply voltage Vcc (5 V) on node N12.

At time T0, negative generating circuit 8 is activated, whereby an erase mode operation is executed. Here, the control signal A is raised to a H level, and transistor 21 is turned off. Node N13 attains an electrically floating state. When the potential of node N11 begins to be reduced according to the operation of negative voltage generating circuit 8, the potential of node N13 similarly reduces according to the law of conservation of charges. The potential difference V between nodes N13 and N11 is V=Q/C and becomes 5 V, where Q is the charge in node N13 and C is the capacitance of capacitor 22. Therefore, the potential of node N13 is reduced maintaining substantially the same potential difference according to the potential of node N11. Node N12 has its voltage value controlled by voltage comparison circuit 410 to maintain a voltage similar to that at node N13. Because inverter circuit 28 operates with the power supply voltage Vcc and ground potential GND as the operating power supply voltages when the potential of node N12 becomes 0 V at time T1, the potential of node N12 can not be made to follow the potential of node N13 after time T1. Therefore, the potential of node N12 is maintained at 0 V after time T1.

Negative voltage generating circuit 8 causes the voltage of node N11 to fall to the control limit of −10 V at which level the output voltage value is clamped (time T2).

In voltage conversion circuit 420, the voltage level of the latched data is reduced according to reduction in voltages of nodes N11 and N12. When 5 V is applied initially as the input signal IN, the output signal OUT attains the voltage of node N11, i.e. the level of −10 V. When the input signal IN is 0 V, the output signal OUT attains the level of 0 V level on node N12.

When an input signal IN is continuously applied at the level of 5 V in this voltage conversion circuit 420, current flows to node N12 via transistor 17 by the input signal IN. Therefore, it is necessary to set the input signal IN to the electrically floating state of 0 V during operation of negative voltage generating circuit 8.

The voltage generating circuit shown in FIG. 18 may be applied to the negative voltage switch shown in FIG. 17. In this case, the output of the unit decoder circuit is inverted and supplied as the input signal IN. After the provision of this output of the unit decoder circuit, transistor 260 shown in FIG. 17 is set to an off state, and the input signal IN is set to an electrically floating state of 0 V. Then, negative voltage generating circuit 8 is activated, whereby the voltages of nodes N11 and N12 are reduced. The output signal OUT is transmitted to the gate of the word line WL driving circuit (transistor 322 in FIG. 17).

The voltage generating circuits shown in FIGS. 13 and 18 may be employed in another structure. More specifically, when a memory cell array is divided into a plurality of blocks and an erase operation is possible in the units of blocks, voltage conversion circuit 304 or 420 is respectively provided in each block in addition to the negative voltage switch. A selection operation of a word line is executed in each block. A block select signal is provided as the input signal IN of voltage conversion circuit 304 or 420. Negative voltage generating circuit 8 is driven with the input signal IN in an electrically floating state of 0 V. Alternatively, an input signal IN which is converted in level using a level shift circuit shown in FIG. 17 can be provided. A negative voltage word line driving signal is transmitted only to the selected block. A negative voltage is transmitted to the word line selected by the decoder circuit via the above-described negative voltage switch and drive transistor. More specifically, a negative voltage is applied to a selected word line only in a desired block, and the word lines in the remaining blocks are set to a non-selected state of 0 V.

Embodiment 4

Figure 1A:
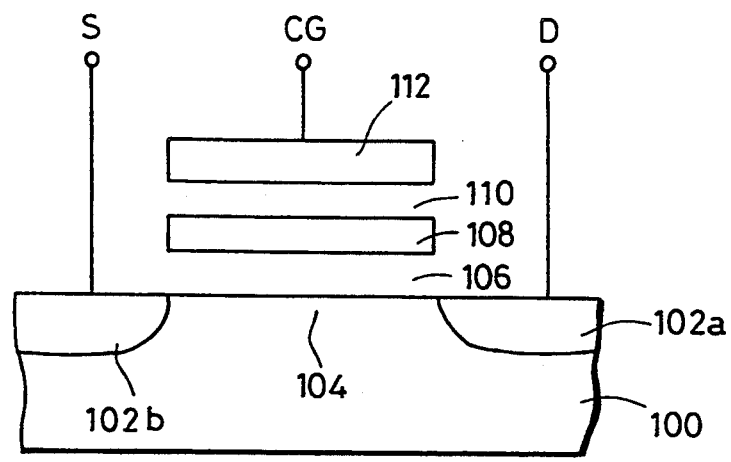
FIG. 1A is a sectional view of a structure of a flash memory cell.
Figure 1B:
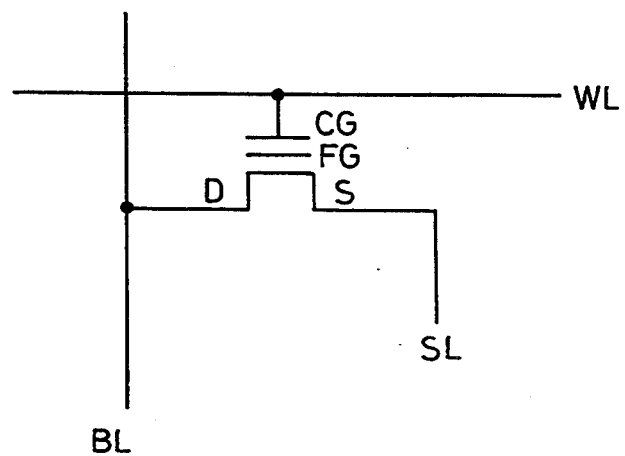
FIG. 1B is an electrical equivalent circuit diagram of the flash memory cell of FIG. 1A.
Figure 2:
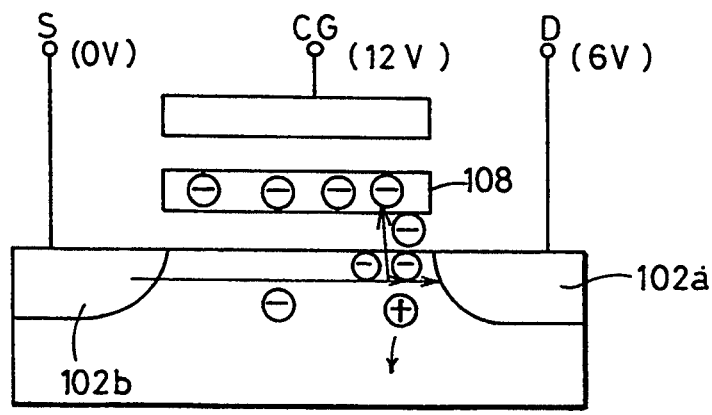
FIG. 2 is a diagram used for describing a programming operation of a flash memory.
Figure 3:
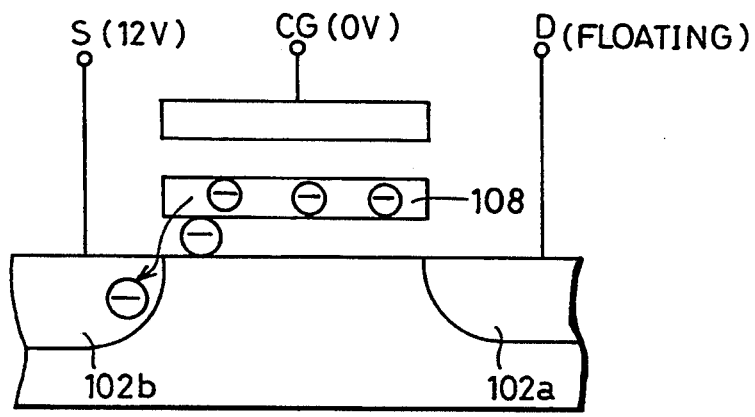
FIG. 3 is a diagram used for describing an erase operation of a flash memory cell.
Figure 4:
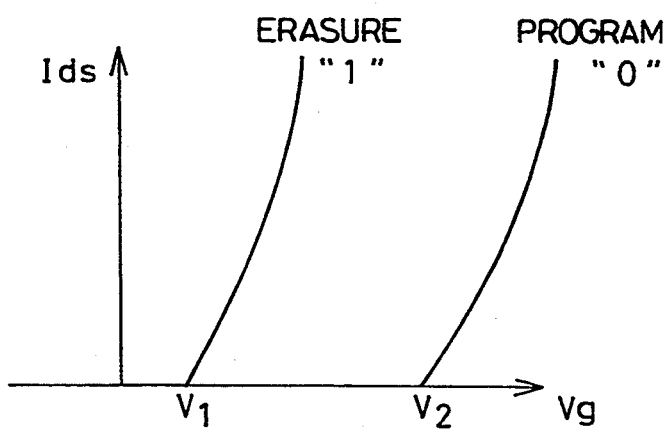
FIG. 4 is a diagram showing the threshold voltage in an erased state and a programmed state of a flash memory cell.
Figure 5:
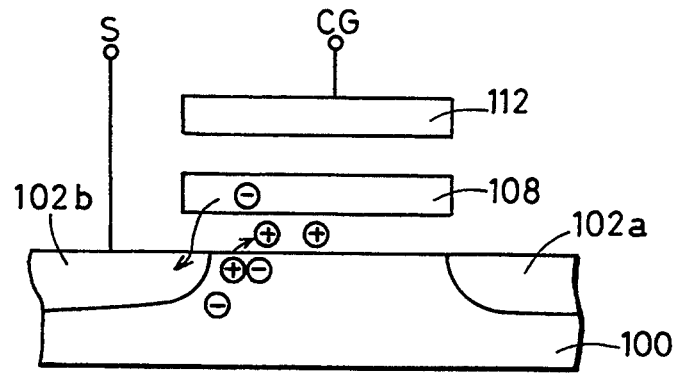
FIG. 5 is a diagram used for describing the problems of a conventional source erasure method.
Figure 6:
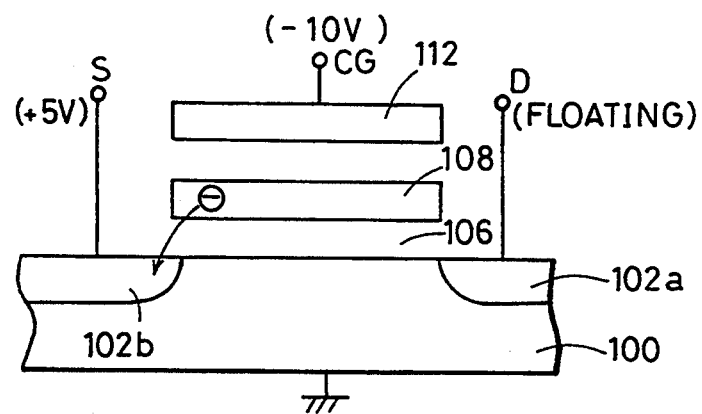
FIG. 6 is a diagram for illustrating a memory cell erase method according to a conventional gate-source erase method.
Figure 7:
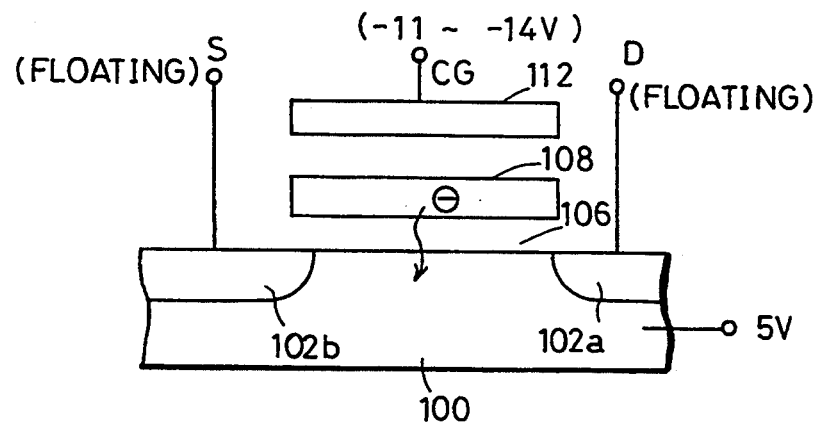
FIG. 7 is a diagram showing an erase method of a memory cell according to a conventional gate-substrate erase method.
Figure 20:
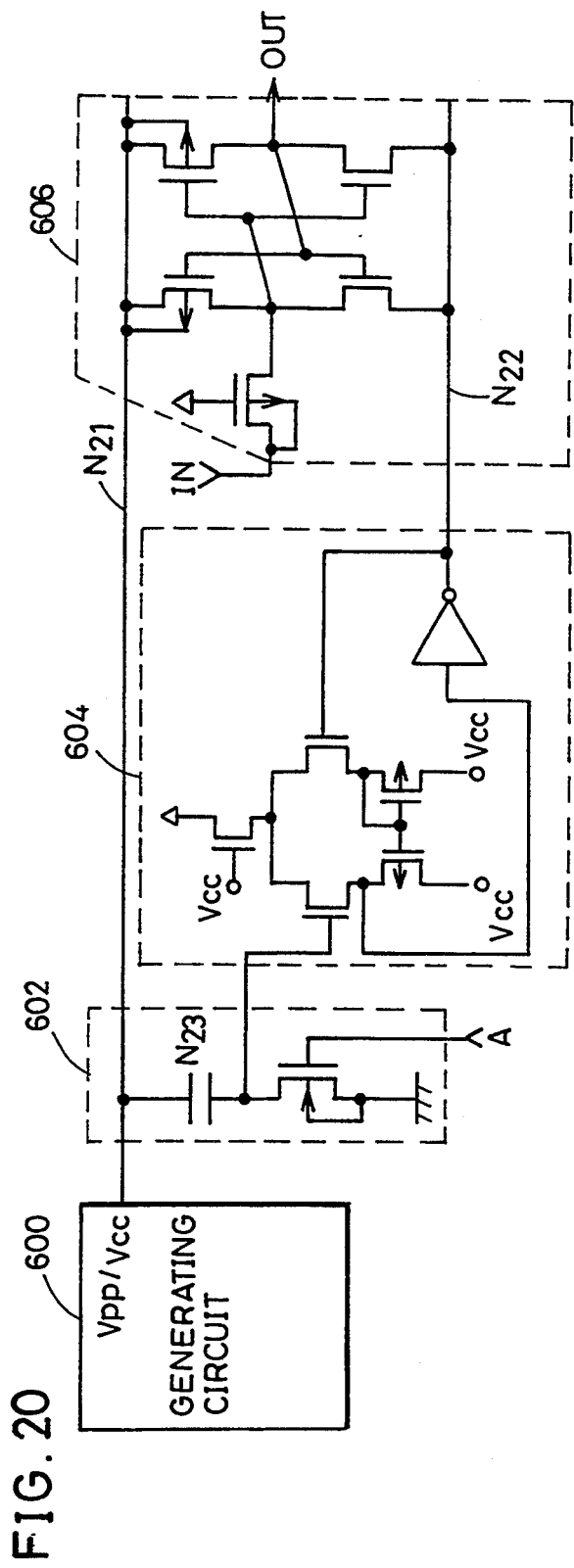
FIG. 20 is a diagram showing a voltage generating circuit according to a third embodiment of the present invention.
Figure 21:
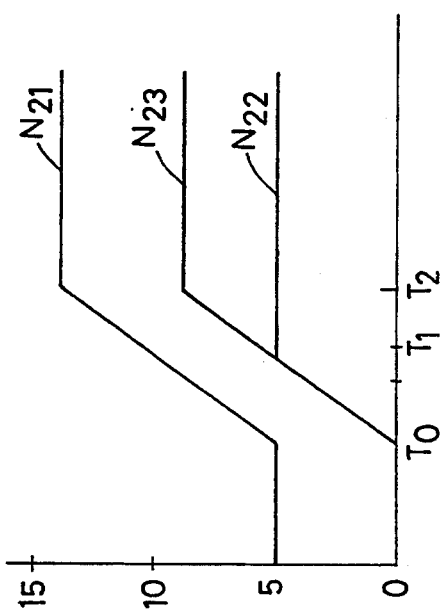
FIG. 21 is a signal waveform diagram showing the operation of the voltage generating circuit shown in FIG. 20.

FIG. 20 shows a structure of a voltage generating circuit according to a fourth embodiment of the present invention. Referring to FIG. 20, a voltage Vpp/Vcc is transmitted to node N21 from a Vpp/Vcc generating circuit 600. A level shift circuit 602 shifts the voltage of node N23 towards a high voltage Vpp when the high voltage Vpp is generated from Vpp/Vcc generating circuit 600. Voltage comparison circuit 604 operates to maintain the potential difference between the output signal of level shift circuit 602 and the potential on node N22 at a constant level. Voltage conversion circuit 606 operates with the voltage on node N21 and that on node N22 as the operating power supply voltages. The structures of level shift circuit 602, voltage comparison circuit 604 and voltage conversion circuit 604 are similar to those shown in FIG. 4 with only difference in their voltage polarity. Therefore, the details will not be repeated. The operation thereof will be described with reference to the operation waveform diagram of FIG. 21.

When Vpp/Vcc generating circuit 600 generates the power supply voltage Vcc prior to time T0, the voltage of node N21 attains the level of the power supply voltage Vcc. Under such a state, the control signal A attains a H level, and node N23 is discharged to ground potential. Voltage comparison circuit 604 operates to maintain the voltage of node N23 and the voltage of node N22 at a same value. Therefore, the voltage value of node N22 is also 0 V. A data is latched in advance in voltage conversion circuit 606. When an input signal IN of 0 V is applied, the output signal OUT attains the voltage level on node N21. When an input signal IN of 5 V is applied in advance, the output signal OUT attains the voltage level on node N22.

At time T0, Vpp/Vcc generating circuit 600 is activated, whereby the voltage on node N21 begins to rise. The control signal A is set to a L level at the time or prior to activation of Vpp/Vcc generating circuit 600. This causes node N23 to attain an electrically floating state, whereby the voltage on node N12 rises according to the rise of the voltage on node N21 due to the law of conservation of charges. In response to the rise of the voltage on node N23, the voltage on node N22 also rises according to the function of voltage comparison circuit 604. Because the maximum output of voltage comparison circuit 604 is 5 V when the voltage of node N23 attains the level of 5 V at time T1, the voltage of node N22 is maintained at 5 V (the inverter circuit included in voltage comparison circuit 609 uses the power supply voltage Vcc and ground potential GND as the operating power supply voltages). After time T1, the voltage of node N22 is maintained at a steady state of 5 V.

When the voltage of node N23 rises to a predetermined voltage level (for example 12 V) at time T2, the voltage of node N23 is maintained at a voltage level that is lower by approximately 5 V. When a voltage of 0 V is applied in advance as the input signal IN under such a state, the output signal OUT attains the level of a high voltage (approximately 12 V) on node N21. When a voltage of approximately 5 V is set as the input signal IN, the output signal OUT attains the level of 5 V.

The supply of an excessive high voltage to a transistor is prevented also in the structure of FIG. 20 because the maximum voltage value in any transistor is the voltage difference between the high voltage Vpp and the power supply voltage Vcc. The structure shown in FIG. 20 is used as the Vpp switch of FIG. 15.

Embodiment 5

Figure 22:
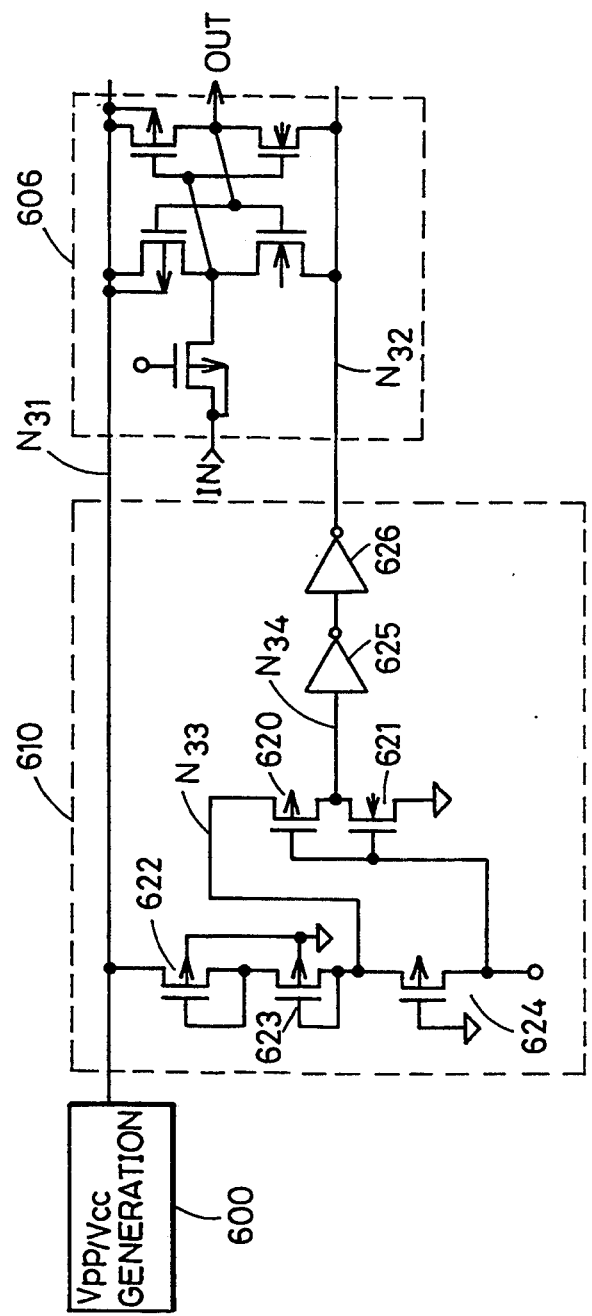
FIG. 22 is a signal waveform diagram showing the operation of a voltage generating circuit according to a fourth embodiment of the present invention.

FIG. 22 is a diagram showing a structure of a voltage generating circuit according to a fifth embodiment of the present invention. Referring to FIG. 22, a voltage generating circuit receives an output of Vpp/Vcc generating circuit 600 at a node N31. Voltage detection circuit 610 detects the voltage level on node N31 to adjust the voltage level on node N31 according to the detection result. Voltage conversion circuit 606 has a structure identical to the voltage conversion circuit shown in FIG. 22, and operates with the voltages of nodes N31 and N32 as the operating power supply voltage. The operation of this voltage conversion circuit 606 is similar to that shown in FIG. 20, and their description will not be repeated.

Voltage detection circuit 610 includes p channel MOS transistors 622 and 623 resistor-connected between nodes N31 and N33, and a p channel MOS transistor 624 provided between node N23 and the power supply voltage supplying node. Transistor 624 has its gate connected to ground potential GND.

Voltage detection circuit 610 further includes a p channel MOS transistor 620 and n channel MOS transistor 621 connected between node N33 and ground potential GND in a complementary manner, and two stage cascaded inverter circuits 625 and 626 for receiving the signal voltage of node N34 (the node of transistors 620 and 621). The operation of voltage conversion circuit 610 will be described hereinafter.

When Vpp/Vcc generating circuit 600 generates the power supply voltage Vcc, node N33 attains the level of the power supply voltage Vcc (transistor 624 is turned on). Here, transistors 620 and 621 are turned off and on, respectively, and node N34 attains the level of ground potential GND. Therefore, node N32 attains the level of ground potential GND (0 V) when node N31 attains the level of the power supply voltage Vcc (5 V).

Upon generation of a high voltage from Vpp/Vcc generating circuit 600, the potential of node N31 begins to rise. In response, the potential of node N33 begins to rise (because transistors 622 and 623 are turned on). Transistors 622 and 623 have a resistance sufficiently greater than transistor 624. Node N33 is connected to the source of transistor 620. Transistor 620 receives the power supply voltage Vcc at its gate. The voltage level of node N33 is clamped to the sum of the power supply voltage Vcc and the absolute value of the threshold value voltage of transistor 620.

The current supply capability of transistor 620 is set sufficiently greater than that of transistor 621. Therefore, node N34 is charged via transistor 620 to reach a predetermined voltage level. When the resistance of transistor 620 is sufficiently smaller than the resistance of transistor 621, the voltage level of node N34 attains the level of power supply voltage Vcc. If the values of the on-resistance of transistors 620 and 621 are substantially equal, the voltage will take a level determined by the resistances of the two transistors. When the voltage level of node N34 rises, the voltage of node N32 also rises by the amplification of inverter circuits 625 and 626. Inverter circuits 625 and 626 operate with the power supply voltage Vcc and the ground potential GND as the operating power supply voltages. Therefore, the voltage level of node N32 rises eventually to the level of the power supply voltage Vcc of 5 V. When node N31 attains the level of the high voltage Vpp, node N32 attains the level of the power supply voltage Vcc. Which voltage level of node N31 or N32 should be provided as the output signal OUT is determined by the voltage level of a previously applied input signal IN.

Transistors 622, 623 and 624 have resistance of the same order, and the potential of node N33 may be raised according to the potential raise of node N31 without being clamped.

Because only a voltage of Vpp-Vcc in maximum is applied to any transistor in the above-described structure, sufficient breakdown voltage can be ensured even when the size of the transistor is reduced.

When the voltage detection circuit shown in FIG. 22 is applied to the Vpp switch of FIG. 17, a level shift circuit is provided similar to the negative voltage switch shown in FIG. 17. More specifically, the level of the output signal of unit decoder circuit 250 is to be shifted to a predetermined value towards the high voltage Vpp when the high voltage Vpp is generated. In this case, a high voltage Vpp is supplied instead of the negative voltage Vng in the structure shown in FIG. 17, and the polarity of the transistors of inverter circuits 310 and 312 are changed. For example, the structure shown in FIG. 22 is applied to the Vpp switch shown in FIG. 15.

Embodiment 6

Figure 23:
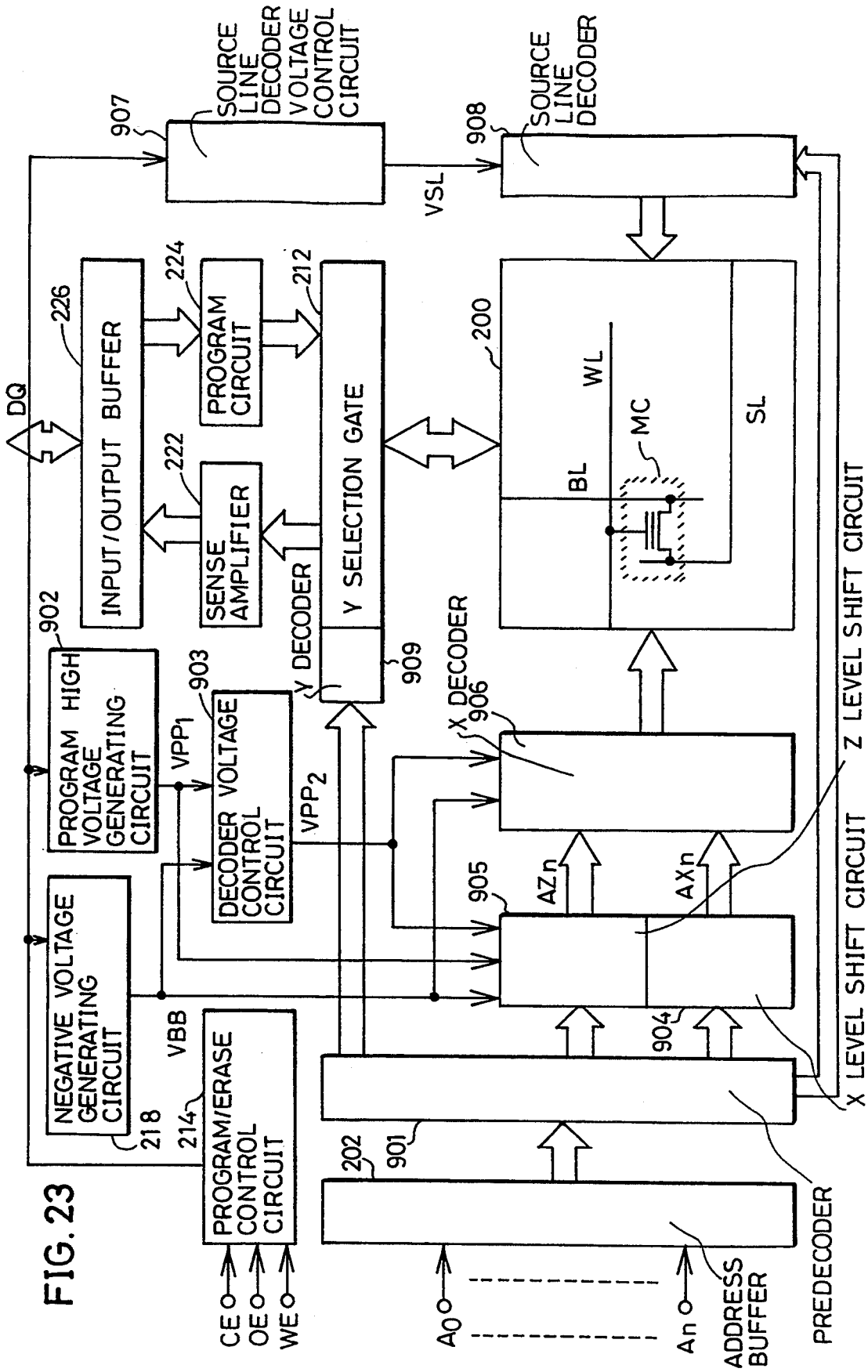
FIG. 23 shows an entire structure of a nonvolatile semiconductor memory device according to a fifth embodiment of the present invention.

FIG. 23 shows an entire structure of a nonvolatile memory device according to a sixth embodiment of the present invention. In FIG. 23, the components corresponding to those in the memory shown in FIG. 8 have the same reference characters denoted.

Referring to FIG. 23, a nonvolatile semiconductor memory device includes a predecoder 901 for predecoding an internal address signal from an address buffer 202, a decoder voltage control circuit 903 for receiving a voltage VBB from a negative voltage generating circuit 218 and a voltage VPP1 from a programing high voltage generating circuit 902 to carry out level conversion of an output signal VPP2 according to the received voltage level, an X level shift circuit 904 and an Z level shift circuit 905 each carrying out level conversion of a predecode signal from predecoder 901, and an X decoder 906 for decoding a predecode circuit output having its level converted from level shift circuits 904 and 905 to drive a selected word line to a predetermined potential.

Figure 8:
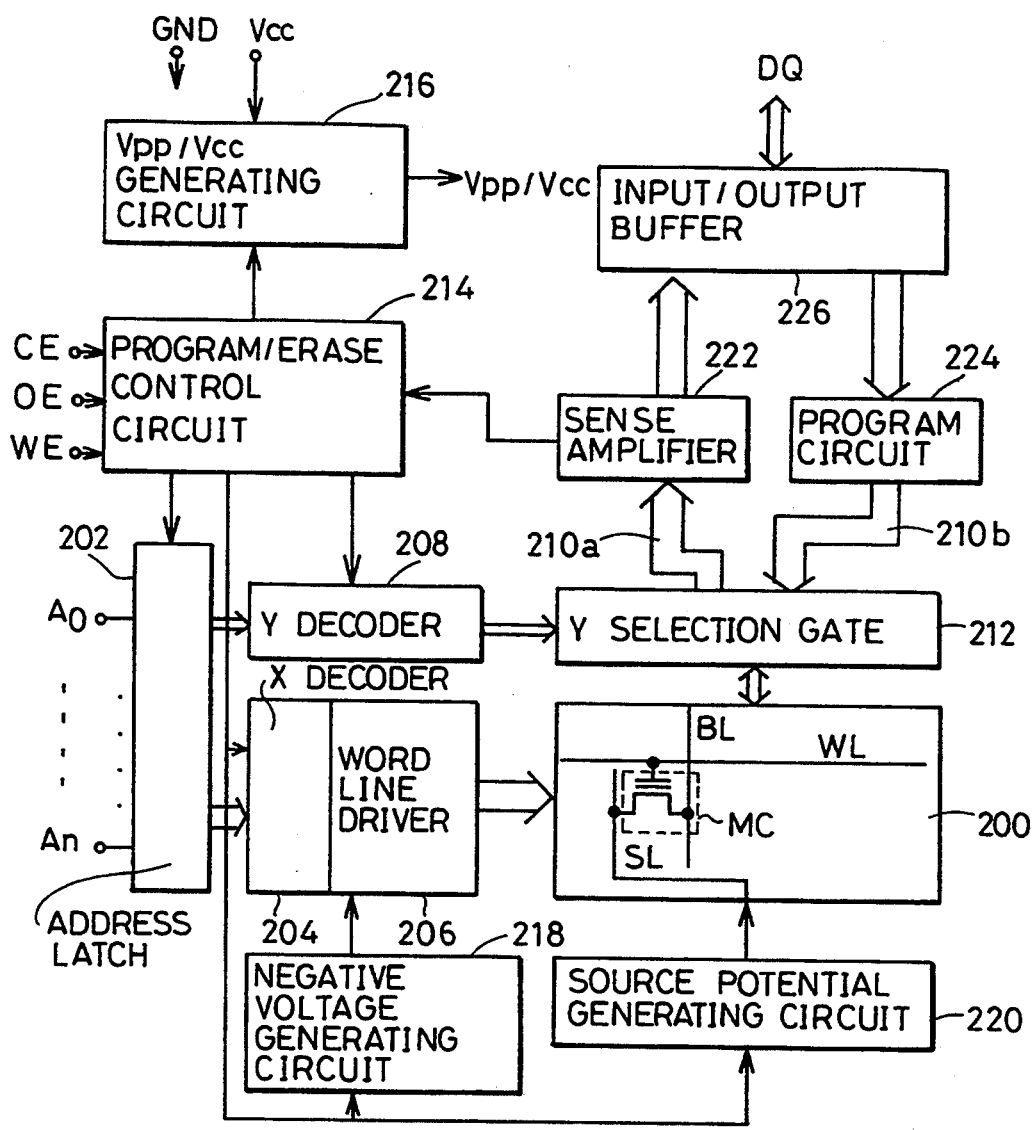
FIG. 8 is a diagram showing the entire structure of a conventional flash memory.
Figure 9:
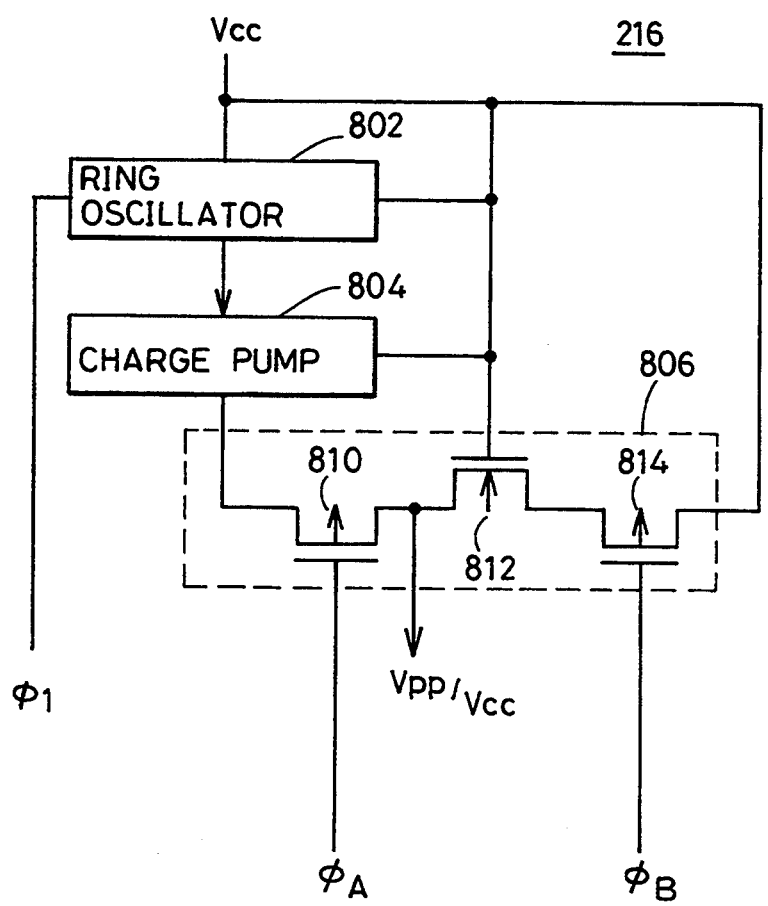
FIG. 9 shows a structure of the Vpp/Vcc generating circuit shogun in FIG. 8.

Program high voltage generating circuit 902 carries out a function similar to that of the Vpp/Vcc generating circuit 216 shown in FIG. 8, and generates a voltage Vcc of 5 V and a high voltage for programing according to the control of a program/erase control circuit 214.

A negative voltage generating circuit 218 generates a negative voltage of approximately −10 V in an erase mode operation under the control of program/erase control circuit 214. The output voltage VBB of negative voltage generating circuit 218 becomes 0 V (GND) in normal data read out mode and data write (program) mode operations.

Decoder voltage control circuit 903 corresponds to the level shift circuit shown in FIGS. 13 and 18. Decoder voltage control circuit 903 shifts the output voltage VPP2 in the positive direction at the time of generating a program high voltage, and in a negative direction when a negative voltage is generated for erasure.

X level shift circuit 904 carries out level conversion of a predecode signal output from predecoder 901 according to output voltages VBB, VPP1, and VPP2 of negative voltage generating circuit 218, write high voltage generating circuit 902, and decoder voltage control circuit 903, respectively. The logic of the predecode circuit output is maintained.

Although Z level shift circuit 905 carries out a level shift operation similar to that of X level shift circuit 904, the logic of the output signal of Z level shift circuit 905 is opposite to that of X level shift circuit 904 in an erasing operation because the logic of the word line potential differs between the erase operation and the programming operation.

X decoder 906 decodes an output signal AXn of X level shift circuit 904 to select and transmit on each word line the output of Z level shift circuit 905 according the decoded result. X decoder 906 receives as the operating power supply voltages the output voltage VPP2 of decoder voltage control circuit 903 and the output voltage VBB of negative generating circuit 218. Therefore, X decoder 906 carries out a decode operation and a word line driving operation according to a level-converted signal.

The non-volatile semiconductor memory device further includes a source line decoder voltage control circuit 907 for generating a voltage to be transmitted to a source line SL in a memory cell array 200 under the control of a write/erase control circuit 214, and a source line decoder 908 for decoding a predecode signal from predecoder 901 and transmitting an output voltage VSL of source line decoder voltage control circuit 907 to a selected source line according to the decoded result.

Source line decoder voltage control circuit 907 generates a voltage of the power supply voltage Vcc (5 V) at the time of erase operation mode, and the voltage of ground potential GND (0 V) at the time of write operation mode and normal data read out operation mode.

Source line decoder 908 sets the non-selected source line to an electrically floating state in any operation mode. This is to reduce consumption current and to prevent erroneous selection of a memory cell.

In the structure shown in FIG. 23, level conversion is carried out between the output of predecoder 901 and the input of X decoder 906. Because one unit level shift circuit is provided for a plurality of word lines, the increase in area by the provision of level shift circuits 905 and 904 can be suppressed to a minimum. Furthermore, because the pitch of the unit level shift circuit is secured sufficiently even when the word line pitch is reduced, a unit level shift circuit can be arranged effectively.

Because X decoder 906 does not carry out level conversion, the size (occupying area) of X decoder 906 can be set to a minimum, so that a non-volatile semiconductor memory device of high density can be obtained. The structure and operation of each circuit will be described hereinafter.

Figure 24:
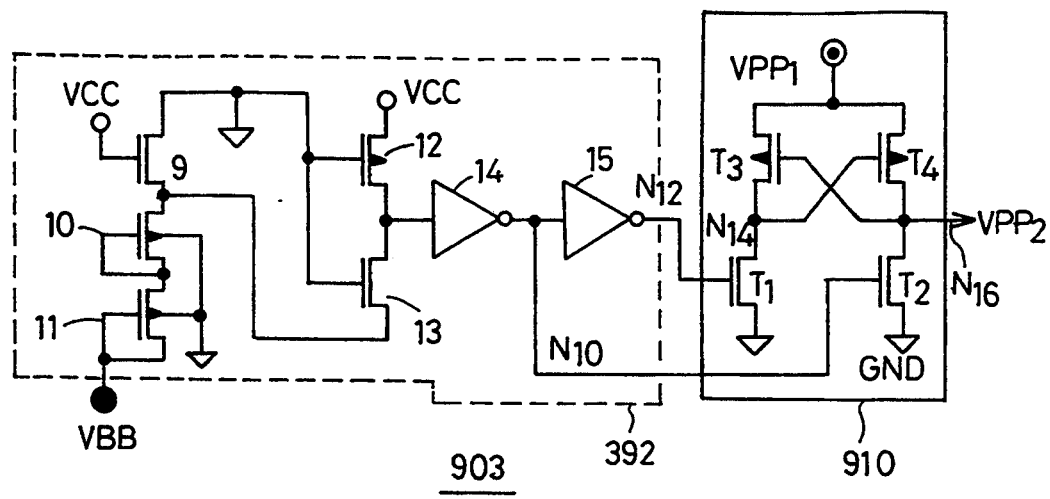
FIG. 24 specifically shows a structure of the decoder voltage control circuit shown in FIG. 23.

FIG. 24 shows a structure of the decoder voltage control circuit shown in FIG. 23. Referring to FIG. 24, decoder voltage control circuit 903 includes a voltage detection circuit 392 having a structure similar to that shown in FIG. 13, and a high voltage switch circuit 910 responsive to an output of voltage detection circuit 392 to generate a voltage VPP2.

Voltage detection circuit 392 has its output voltage level switched according to the voltage VBB from negative voltage generating circuit 218. The operation of this voltage detection circuit 392 is similar to that shown in FIG. 13. The components of voltage detection circuit 392 corresponding to those shown in FIG. 13 have the same reference characters denoted and their detailed description will not be repeated.

Figure 25:
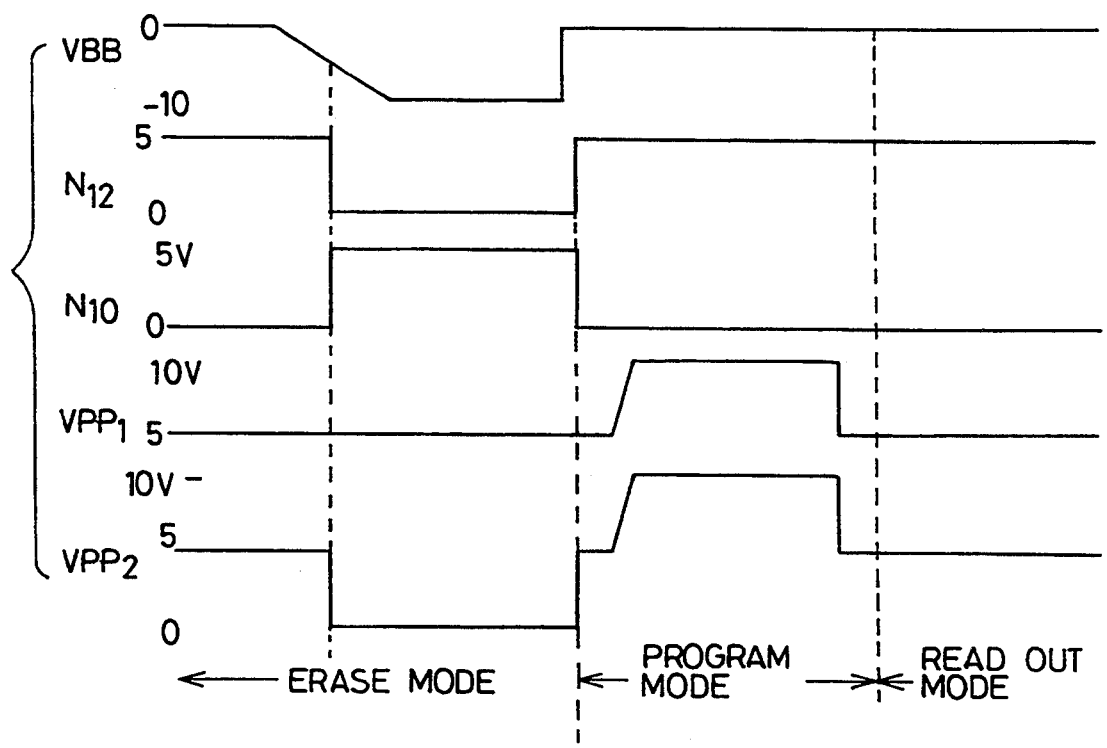
FIG. 25 is a signal waveform diagram showing the operation of the decoder voltage control circuit shown in FIG. 24.

High voltage switch circuit 910 operates with the voltage VPP1 from program high voltage generating circuit 902 as one operating power supply voltage and ground voltage GND as the other operating power supply voltage. High voltage switch circuit 910 includes p channel MOS transistors T3 and T4 having their drains and gates cross-coupled, an n channel MOS transistor T1 responsive to an output of inverter 15 for coupling node N14 (the drain of transistor T3) to ground potential GND, and an n channel MOS transistor T2 responsive to an output of inverter 14 to couple node N16 to ground potential. Transistors T3 and T4 have their sources connected to receive the voltage VPP1. The voltage VPP2 is provided from node N16. The operation thereof will be described hereinafter with reference to the operation waveform diagram of FIG. 25.

(i) Erase Mode

In an erase mode operation, the voltage VPP1 is maintained at the operating power supply voltage Vcc of 5 V. The voltage VBB from negative voltage generating circuit 218 is reduced to the negative voltage of −10 V.

When the voltage VBB is 0 V, the outputs of inverters 14 and 15 attain a L level and a H level, respectively. More specifically, the voltages of nodes N10 and N12 are 0 V and 5 V, respectively. Because transistor T1 is turned on and transistor T2 is turned off, node N16 is charged via transistor T4 to attain the level of the voltage VPP1 (5 V).

When negative voltage generating circuit 218 operates and the voltage VBB is reduced, the outputs of inverters 14 and 15 attain a H level and a L level, respectively during the reduction of VBB (when VBB=−5 V). More specifically, nodes N10 and N12 become 5 V and 0 V, respectively. In response, transistors T1 and T2 are turned off and on, respectively, whereby node N16 attains the voltage VPP2 of 0 V. More specifically, when generating an negative voltage in an erase operation, VBB=−10 V, VPP1=5 V, and VPP2=0 V.

(ii) Programming Mode

Negative voltage generating circuit 218 does not operate and the voltage VBB is at the ground voltage of 0 V. Therefore, node N10 attains the ground voltage of 0 V, and node N12 attains the operating power supply voltage Vcc of 5 V. Transistors T1 and T2 are turned on and off, respectively. Therefore, the voltage VPP2 of node N16 is 5 V (VPP1=5 V).

Because the mode is set to a programming operation, the voltage VPP1 rises from the operating power supply voltage of 5 V to a high voltage of 10 V when program high voltage generating circuit 902 operates. Because node N14 is discharged to ground potential by transistor T1, node N16 is charged according to the rise of the voltage VPP1 via transistor T4, whereby the voltage VPP2 becomes 10 V according to the rise of the voltage VPP1.

Although a voltage of 10 V is applied across the source and drain of transistors T2 and T3, decoder voltage control circuit 903 is not affected by the word line pitch and the like similarly to the structure of negative voltage generating circuit 218 and program high voltage generating circuit 903. Therefore sufficient area can be utilized, and the breakdown voltage characteristics can be maintained even in reducing the size of the devices.

(iii) Data Read Out Mode

The voltage VBB is 0 V, the voltage VPP1 is 5 V, and the voltage VPP2 is 5 V.

By controlling high voltage switch circuit 910 with the output of voltage detection circuit 392, the level of the output voltage VPP2 can be converted (shifted) according to generated voltage at the time of generation of a negative voltage and a program high voltage.

Figure 26:
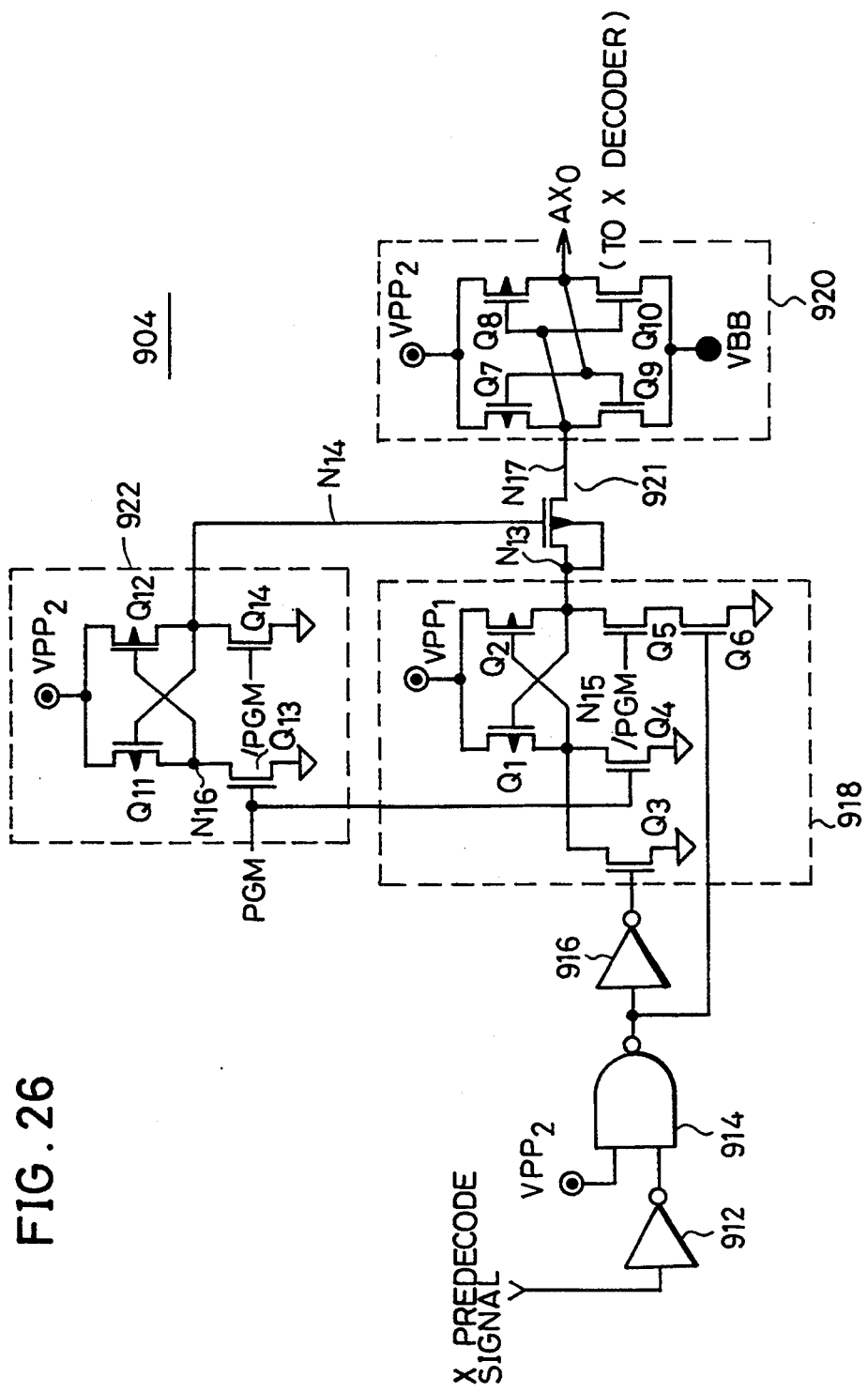
FIG. 26 specifically shows a structure of the X level shift circuit shown in FIG. 23.

FIG. 26 specifically shows a structure of an X level shift circuit related to one decode signal. Referring to FIG. 26, an X level shift circuit 904 includes an inverter circuit 912 for receiving a predecode signal (0 V/5 V level) from predecoder 901, a 2-input NAND circuit 914 for receiving the voltage VPP2 at one input and the output of inverter circuit 912 at the other input, an inverter circuit 916 for receiving an output of NAND circuit 914, a high voltage switch circuit 918 responsive to the outputs of NAND circuit 914 and inverter circuit 916 for providing a signal of a voltage level according to the operation mode, a level conversion circuit 920 for converting the level of an output of high voltage switch circuit 918, a transfer gate 921 for selectively disconnecting high voltage switch circuit 918 and level conversion circuit 920, and a high voltage switch circuit 922 for controlling the on/off of transfer gate 921.

High voltage switch circuit 918 includes p channel MOS transistors Q1 and Q2 having the gate and drain cross-coupled, an n channel MOS transistor Q3 responsive to an output of inverter circuit 916 for discharging node N15 (the gate of transistor Q2) to ground potential, an n channel MOS transistor Q4 responsive to a program designating signal PGM (generated from program/erase control circuit 214 shown in FIG. 23) for discharging node N15 to ground potential, an n channel MOS transistor Q5 turned on in response to a complementary program designating signal /PGM, and an n channel MOS transistor Q6 turned on in response to an output of NAND circuit 914. Transistors Q5 and Q6 are NAND-connected between node N13 and ground potential supplying node. Node N13 is discharged to the level of ground potential when both transistors Q5 and Q6 are turned on.

Transistors Q1 and Q2 have their sources connected to receive the voltage VPP1. A signal of the level of ground potential or the voltage VPP1 appears on node N13.

High voltage switch circuit 922 includes p channel MOS transistors Q11 and Q12 having the gate and drain cross-coupled, an n channel MOS transistor Q13 responsive to a program designating signal PGM for discharging node N16 (the gate of transistor Q12) to ground potential, and an n channel MOS transistor Q!4 responsive to a complementary program designating signal /PGM for discharging node N14 to ground potential. Transistors Q11 and Q12 have their sources connected to receive the voltage VPP2.

High voltage switch circuit 922 reliably turns off transfer gate 921 in a programming operation (generation of a program high voltage) to prevent generation of leakage current through transfer gate 921. Node N14 is connected to the gate of transfer gate 921. Transfer gate 921 is formed of a p channel MOS transistor.

Figure 27:
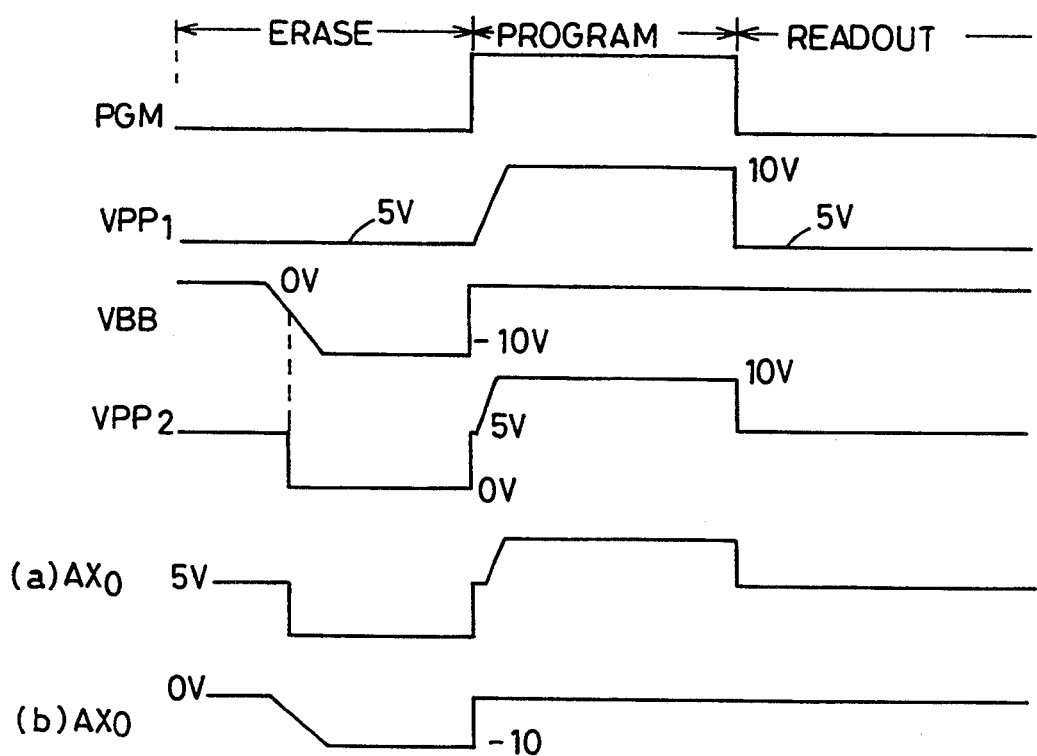
FIG. 27 is a signal waveform diagram showing the operation of the X level shift circuit.

Level conversion circuit 920 has a structure similar to the level conversion circuit 394 shown in FIG. 13, and implements an inverter latch structure. One inverter includes a p channel MOS transistor Q7 and an n channel MOS transistor Q9, and the other inverter includes a p channel MOS transistor Q8 and an n channel MOS transistor Q10. Level conversion circuit 920 employs the voltage VPP2 as one operating power supply voltage, and the voltage VBB as the other operating power supply voltage. The operation thereof will be described hereinafter with reference to the operation waveform diagram of FIG. 27.

(i) Erase Mode

Signals PGM and /PGM are set to a L level and a H level, respectively. When the voltage VVP2 is 5 V, a predecode signal from predecoder 901 is input. The voltage VPP1 is 5 V. When the predecode circuit attains a H level (5 V), the output of inverter circuit 912 becomes 0 V and the output of NAND circuit 914 becomes 5 V (a high level). (Inverter circuits 912 and 916, and NAND circuit 914 use the power supply voltage Vcc (5 V)). Transistor Q6 is turned on, and node N13 is discharged to the level of ground potential. Because transistor Q14 is turned on and transistor Q13 is turned off in high voltage switch circuit 922, node N14 attains the level of ground potential. The voltage of 0 V of node N13 is transmitted to the gates of transistors Q8 and Q10, whereby the signal AX0 attains the level of the voltage VPP2 by transistor Q8 (refer to FIG. 27(a)).

When the predecode signal attains a L level (0 V), the outputs of NAND circuit 914 and inverter circuit 916 attain a L level (0 V) and a H level (5 V), respectively, and node N15 is discharged by transistor Q3. The voltage VPP1 (5 V) charged by transistor Q2 of node N13 is latched in level conversion circuit 920, whereby the output AX0 attains the level of voltage VBB (0 V) (refer to FIG. 27(b)).

Negative voltage generating circuit 218 operates, and the voltage VBB is reduced to the negative voltage of 10 V. The voltage VPP2 falls from 5 V to 0 V during reduction of the voltage VBB. When the signal AX0 initially latched in level conversion circuit 920 attains a H level of 5 V, this signal AX0 changes to a H level of 0 V in response to the fall of the voltage VPP2 (refer to FIG. 27(a)).

When the initially latched signal AX0 attains a L level of 0 V, the signal AX0 is reduced in voltage level in accordance with reduction of the voltage VBB.

When the voltage VPP2 changes from 5 V to 0 V, the output of NAND circuit 914 attains a H level (5 V) regardless of the logic level of the predecode signal, and the output of inverter circuit 916 attains a L level (0 V). Node N13 is fixed to the level of ground potential. Under such a state, transistor Q9 is turned on, so that transfer gate 921 maintains an off state because nodes N13 and N14 are 0 V to prevent leakage current via transfer gate 921 even if the voltage of node N17 is reduced according to reduction of voltage VBB. Furthermore, even if nodes N13 and N17 are set initially to 5 V, transfer gate 921 is similarly turned off to prevent leakage current because nodes N13 and N17 both are 0 V in response to the change of the voltage VPP2 from 5 V to 0 V.

As described above, the signal AX0 has its level converted reliably according to the voltage VBB in an erase operation (5 V→0 V, 0 V→−10 V).

(ii) Program Operation

The voltage VBB is fixed to 0 V. Signals PGM and /PGM attain a L level and a H level, respectively, and a predecode signal is latched in level conversion circuit 920, similar to the operation in erase operation mode. Here, the voltages VPP1 and VPP2 are still 5 V.

Next, signals PGM and /PGM attain a H level and a L level, respectively, whereby the voltage VPP1 rises to a program high voltage of 10 V from 5 V. Accordingly, the voltage VPP2 also rises. In response, the signal AX0 of a H level latched in level conversion circuit 920 has its level raised. When the latched signal AX0 attains a L level, the voltage level of the signal AX0 is maintained at 0 V.

Because transistors Q3 and Q13 are both turned on when the signal PGM attains a H level, nodes N13 and N14 are equal in voltage level (VPP1=VPP2). Therefore, because the voltage level of node N17 is the level of the voltage VPP2 or ground voltage, transfer gate 921 maintains an off state.

In a program operation, the voltage applied to the transistor is 10 V in maximum. This means that the voltage supplying condition is significantly relaxed in comparison with the conventional case of an negative generating circuit in which the negative voltage and the power supply voltage are used simultaneously.

(iii) Data Read Out Operation

VPP1=VPP2=5 V, and VBB=0 V.

Signals PGM and /PGM attain a level and a H level, respectively.

Under such a state, NAND circuit 914 and high voltage switch circuit 918 function as an inverter amplifier. Level conversion circuit 920 also functions as an inverter amplifier. Because the voltage of node N14 is 0 V, transfer gate 921 maintains its on state to transmit the voltage of node N13 to node N17. Therefore, a signal of a voltage level identical to that of the predecode signal is provided from level conversion circuit 920.

Figure 28:
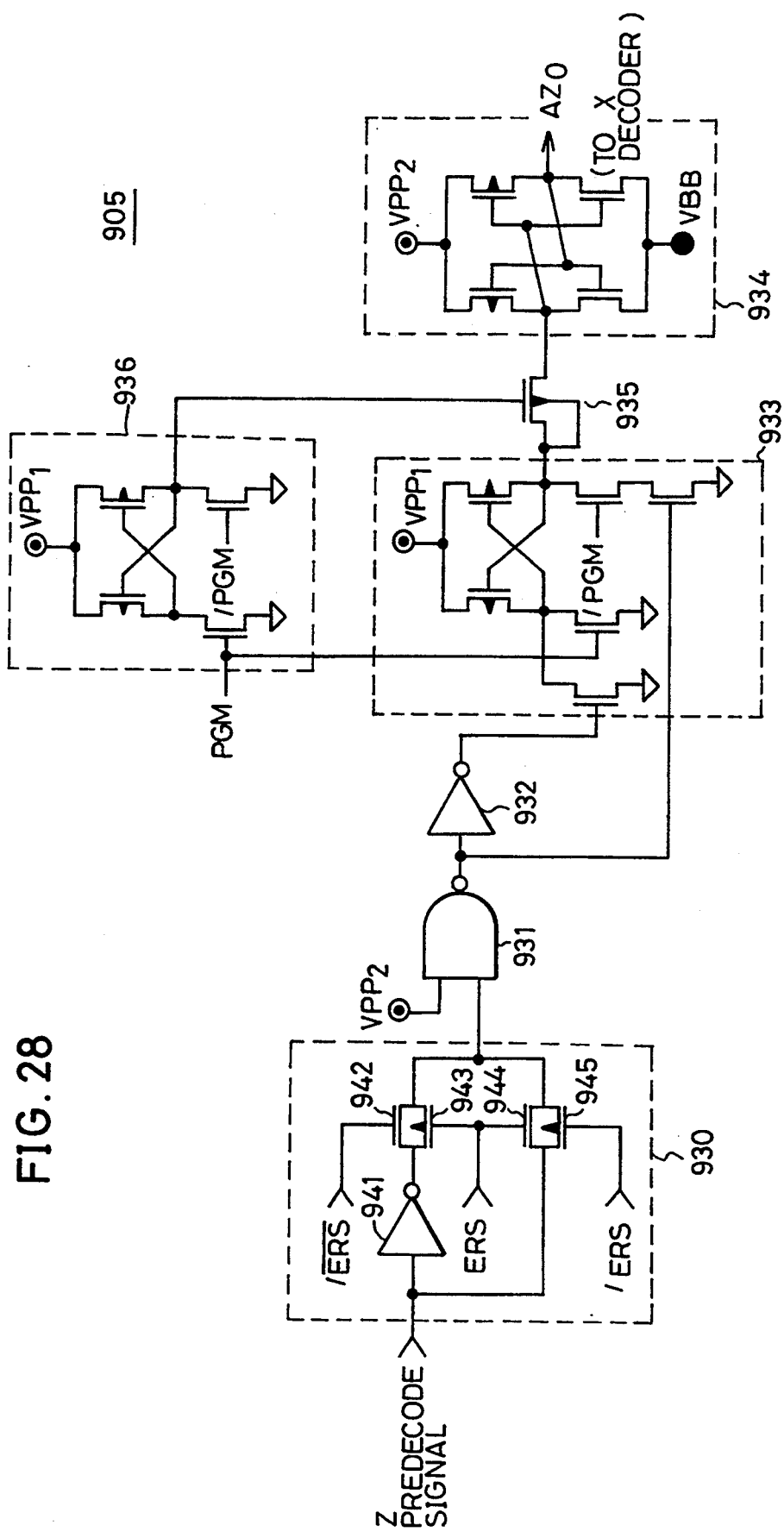
FIG. 28 shows a structure of the Z level shift circuit shown in FIG. 23.

FIG. 28 specifically shows a structure of a Z level shift circuit. Referring to FIG. 28, a Z level shift circuit 905 includes a logic inverting circuit 930 for inverting the logic of a predecode signal in an erase operation, an NAND circuit 931 for receiving the output of logic inverting circuit 930 and the voltage VPP2, an inverter circuit 932 for receiving an output of NAND circuit 931, a high voltage switch circuit 933 responsive to the outputs of NAND circuit 931 and inverter circuit 932 for providing a signal of a logic identical to that of a Z predecode signal, a transfer gate 935 for transmitting the output of high voltage switch circuit 933, a level conversion circuit 934 for converting the level of the output of transfer gate 935, and a high voltage switch circuit 936 for controlling the ON/OFF of transfer gate 935.

Z level shift circuit 905 has a structure similar to that of X level shift circuit 904 except for logic inverting circuit 930. High voltage switch circuits 933 and 936 sets the gate voltage and the source voltage of transfer gate 935 to the same voltage in a program operation and an erase operation to maintain transfer gate 35 at an off state during operation thereof. Level conversion circuit 934 responds to the values of voltages VBB and VPP2 to convert the voltage level of a signal AZ0 latched in an erase operations and a write operation. Because the operation of these circuits is identical to that of the X level shift circuit, their description will not be repeated.

Logic inverting circuit 930 includes an inverter circuit 941 for receiving a Z predecode signal, an n channel MOS transistor 944 responsive to an erase designating signal ERS (generated from program/erase control circuit 214 shown in FIG. 23) to pass a Z predecode signal, a p channel MOS transistor 945 responsive to a complementary erase designating signal /ERS for passing a Z predecode signal, and a p channel MOS transistor 934 and an n channel MOS transistor 942 responsive to signals ERS and /ERS, respectively, for passing the output of inverter circuit 941.

Transistors 942 and 943 form a first bidirectional transmission gate to pass the output of inverter circuit 941 in modes other than an erase operation mode. Transistors 944 and 945 form a second bidirectional transmission gate for passing a Z predecode signal in an erase operation mode.

The output AZ0 of Z level shift circuit 905 is transmitted to a word line selected by an X decoder 906 which will be described afterwards. The selected word line takes a low voltage, a high voltage, and a level of the operating power supply voltage in an erase operation, a programming operation, and a data read out operation, respectively. The signal AXn attains a logical high level in any operation mode when selected. The signal AZn has a low logic level when selected in an erase mode and a high logic level when selected in program mode and data read out mode. Logic inverting circuit 930 is provided for converting the logic level according to the operation modes. The operation thereof will be described hereinafter with reference to the operation waveform diagram of FIG. 29.

In each operation mode, the manner of level conversion of the voltage of the signal latched in level conversion circuit 934 is similar that of X level shift circuit 904. In an erase mode, transistors 945 and 944 are turned on, whereby a signal of a logic opposite to the logic of the Z predecode signal from the predecoder is latched in level conversion circuit 934. The signal ERS maintains a H level during the erase operation mode cycle. The negative voltage is generated after the signal ERS attains a H level and a signal is latched in level conversion circuit 934.

In a program operation mode and a data read out mode, signals ERS and /ERS attain a L level and a H level, respectively, whereby transistors 942 and 943 are turned on. The output of inverter Circuit 941 is selected to be provided to NAND circuit 931. Level conversion circuit 934 latches a signal of a logic level identical to that of the Z predecode signal from the predecoder.

Figure 29:
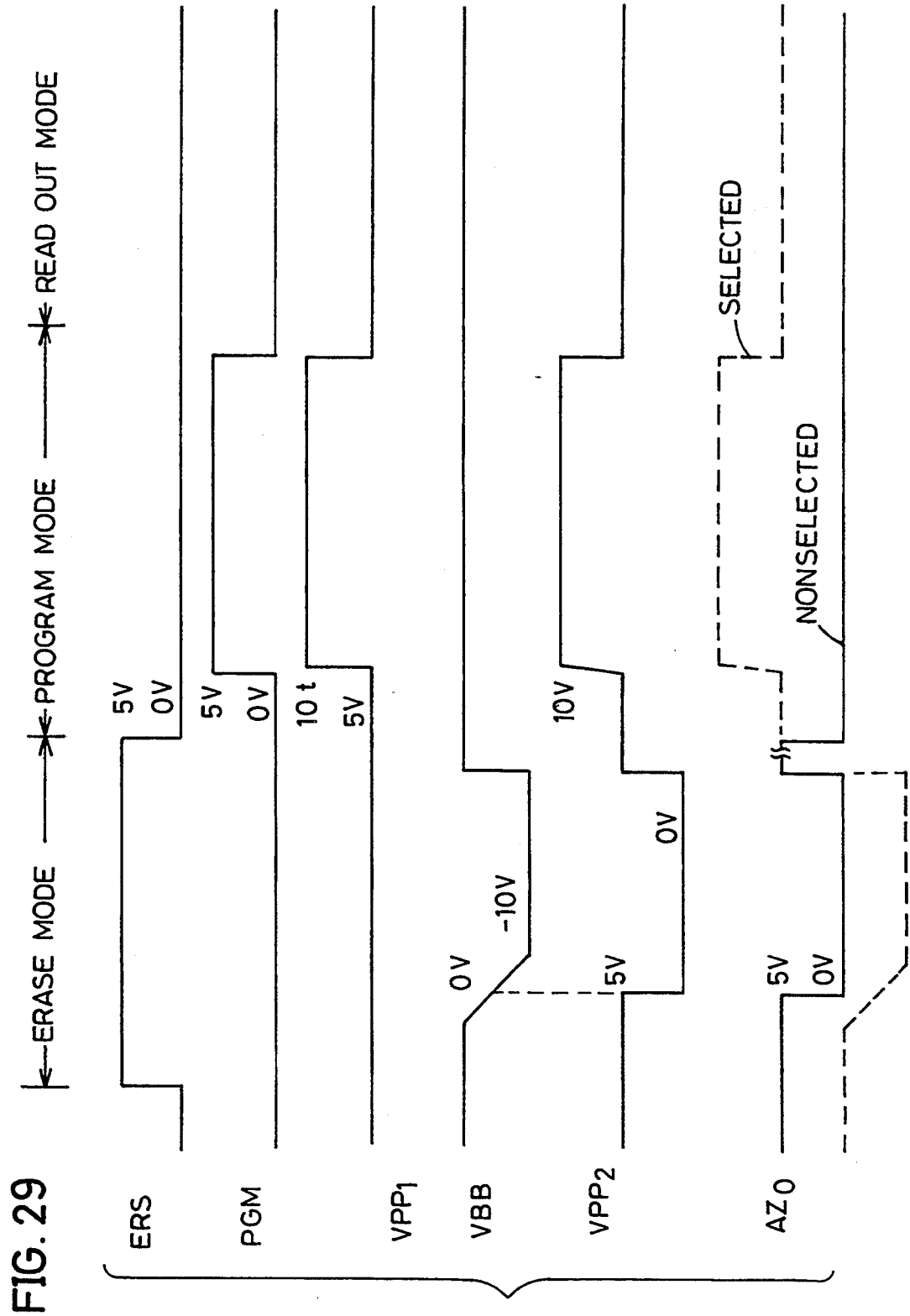
FIG. 29 is a waveform diagram showing the operation of the Z level shift circuit.

Referring to FIG. 29, the voltage changes of the signal AZ0 of a selected state and a non-selected state are indicated by a broken line and solid line, respectively.

Figure 30:
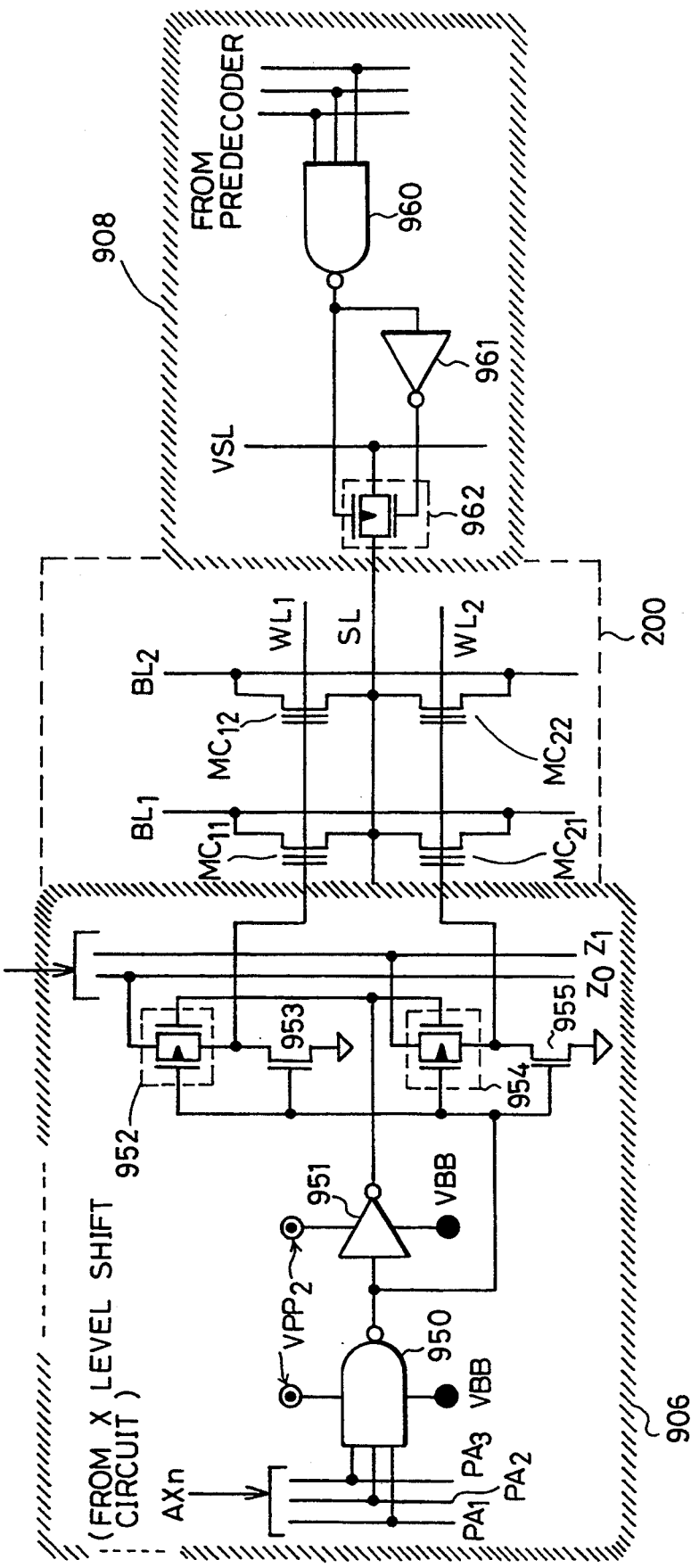
FIG. 30 is a diagram showing a structure of the X decoder and the source line decoder shown in FIG. 23.

FIG. 30 shows the section relating to two word lines of an X decoder 906 and a source line decoder 908. Referring to FIG. 30, a memory cell array 200 includes 2 word lines of WL1 and WL2, 2 bit lines of BL1 and BL2, and a source line SL provided parallel to word lines WL1 and WL2. Memory cells MC11, MC12, MC21 and MC22 are arranged corresponding to each crossing of word lines WL1 and WL2 and bit lines BL1 and BL2. The source line SL is provided common to 2 rows of memory cells connected to the two word lines WL1 and WL2.

X decoder 906 includes an NAND circuit 950 for receiving a predetermined combination of an output AXn of X level shift circuit 904, an inverter 951 for receiving an output of NAND circuit 950, and CMOS transmission gates 952 and 954 responsive to outputs of NAND circuit 950 and inverter 951 for transmitting predecode signals having its level shifted from Z level shift circuit to word lines WL1 and WL2, respectively. CMOS transmission gates 952 and 954 attain a conductive state simultaneously.

NAND circuit 950 and inverter 951 operates with the voltage VPP2 from the decoder voltage control circuit (refer to FIG. 23) as one operating power supply voltage, and the voltage VBB generated from the negative voltage generating circuit as the other operating power supply voltage.

X decoder 906 further includes n channel MOS transistors 953 and 955 responsive to an output of NAND circuit 950 for discharging word lines WL1 and WL2 to the level of ground potential.

Source line decoder 908 includes a NAND circuit 960 for receiving a predecode signal from the predecoder (refer to FIG. 23), an inverter circuit 961 for inverting the output of NAND circuit 960, and a CMOS transmission gate 962 responsive to the outputs of NAND circuit 960 and inverter circuit 961 for transmitting the voltage VSL from the source line decoder voltage control circuit (refer to FIG. 23) to the source line SL. NAND circuit 960 and inverter circuit 961 operate with the power supply voltage Vcc (5 V) and the ground potential (0 V) as the operating power supply voltages. The voltage VSL is 5 V or 0 V. A level converted voltage is not generated in source line decoder 908. Therefore, a predecode signal without level conversion is supplied to NAND circuit 960 from the predecoder. The logic of the predecode signal received by NAND circuit 960 is identical to the level shifted predecode signal AXn received by NAND circuit 950. The operation thereof will be described hereinafter.

(i) Erase Mode Operation

The voltage VPP2 changes from 5 V to 0 V in accordance with reduction of the voltage VBB from 0 V to −10 V. The level converted predecode signal AXn from the X level shift circuit changes similar to the voltage VPP2 or VBB. When the signal AXn attains a selected state of a high logic level, the predecode signal AXn changes similar to the voltage VPP2. When the predecode signal AXn attains a low logic level, it changes similar to the voltage VBB. The bit lines BL1 and BL2 attain an electrically floating state.

When all the signals on signal lines PA1–PA3 attain a high logic level, the output of NAND circuit 950 attains a low logic level and the output of inverter circuit 951 attains a high logic level. This causes both CMOS transmission gates 952 and 954 to attain a conducive state and transistors 953 and 955 to attain a non-conductive state. The signal AZn (Z0, Z1) is transmitted respectively on word lines WL1 and WL2 via transmission gates 952 and 954 attaining a conductive state. The logics of the signals on signal lines Z0 and Z1 are complementary to each other. Therefore, one of word lines WL1 and WL2 attain the level of the voltage VPP2 (0 V) and the other the level of the voltage VBB (−10 V).

In source line decoder 908, the voltage VSL is 5 V. When the output of NAND circuit 960 attains a high logic level (0 V), the voltage VSL is transmitted on the source line SL. As a result, an erase operation of a memory cell connected to the selected word line receiving the negative voltage is carried out.

When the output of NAND circuit 950 attains a high logic level, transmission gates 952 and 954 attain a non-conductive state and transistors 953 and 955 attain a conductive state, whereby word lines WL1 and WL2 are discharged to the level of ground potential. When the voltage VPP2 falls from 5 V to 0 V, transistors 953 and 955 change in gate potential to become non-conductive.

In source line decoder 908, the output of NAND circuit 960 is 5 V, CMOS transmission gate 962 is non-conductive, and the source line SL attains an electrically floating state.

(ii) Program Mode Operation

The voltage VSL is set to 0 V. The potential of the selected bit line is set to 5 V, and the non-selected bit line is set to an electrically floating state. The voltage VBB is maintained at 0 V.

The voltage VPP2 rises from 5 V to 10 V. Therefore, when NAND circuit 950 is selected, the output thereof is 0 V. However, the output of inverter circuit 951 rises in accordance with the rise of the voltage VPP2. Therefore, the voltage VPP2 and the ground voltage are transmitted to word lines WL1 and WL2 via CMOS transmission gates 952 and 954. The determination of which of the word lines WL1 and WL2 receives the high voltage is made by the level converted predecode signal AZn (bits Z0, Z1).

Although the voltage level of the output of NAND circuit 950 changes in accordance with the voltage VPP2 when not selected, the logic thereof is high, and the output of inverter circuit 951 is 0 V (the voltage VBB is 0 V in program mode operation). Therefore, CMOS transmission gates 952 and 954 attain a non-conductive state, transistors 953 and 955 attain a conductive state, and word lines WL1 and WL2 are maintained at 0 V.

Because the voltage VSL is 0 V in source line decoder 908, CMOS transmission gate 962 becomes conductive/non conductive according to the selected/non-selected state of NAND circuit 960, and the source line SL attains a 0 V/floating state.

(iii) Data Read Out Mode Operation

The voltage VPP2 is 5 V, the voltage VBB is 0 V, and the voltage VSL is 0 V. Because the X level shift circuit and the Z level shift circuit do not carry out a level shift operation in this case, the signal AXn (or PA1, PA2, PA3) and the signal AZn (or Z0, Z2) are 0 V (non-selected state) or 5 V (selected state). Therefore, the potential of a selected word line is 5 V and the potential of a non-selected word line is 0 V. The potential of the source line (selected source line) SL relating to the selected word line is 0 V, and the non-selected source line attains an electrically floating state. A read out voltage (approximately 1 V) is applied to the selected bit line, and the non-selected bit line attains an electrically floating state. Data is read out according to the presence/absence of current on the selected bit line.

Figure 31:
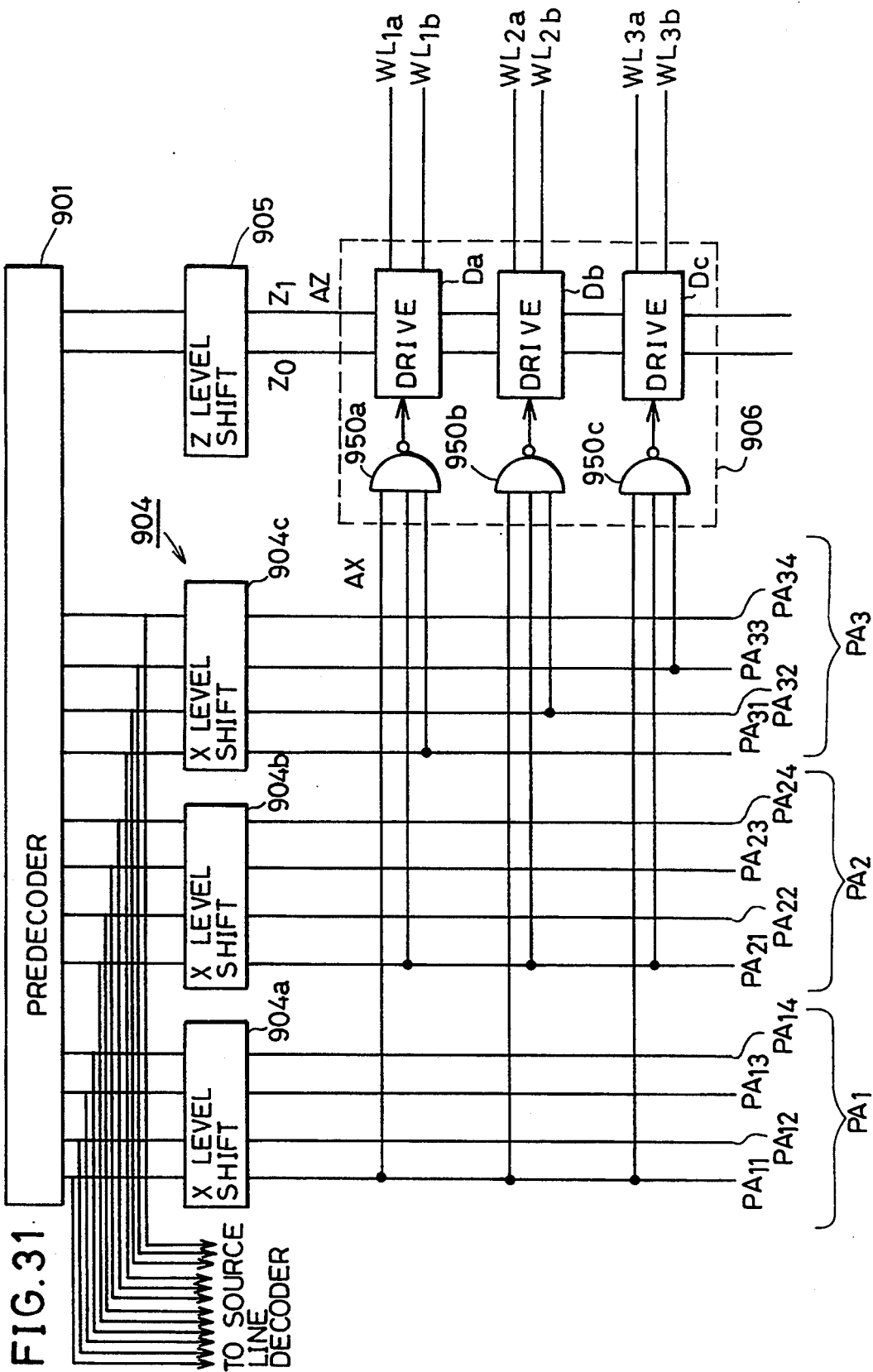
FIG. 31 shows a structure of predecoder signal generating circuitry in the nonvolatile semiconductor memory device shown in FIG. 23.

FIG. 31 shows a structure of the generating system of a predecode signal. Referring to FIG. 31, a X level shift circuit 904 includes X level shift circuits 904a, 904b and 904c provided corresponding to signal buses PA1, PA2, and PA3, respectively. Each of signal buses PA1, PA2 and PA3 includes four signal lines PAij (i=1-3, j=1-4). Predecoder 901 carries out a predecode operation where one signal line is selected in each of signal buses PA1–PA3. X level shift circuits 904a –904c carry out level conversion of a predecode signal from predecoder 901. Each of X level shift circuits 904a –904c includes 4 level shift circuits each shown in FIG. 26.

NAND circuit 950 (950a –950c in the figure) included in X decoder 906 includes three inputs corresponding to the signal buses of PA1–PA3. Each input is coupled to a signal line in a corresponding signal bus. NAND circuit 950 (950a –950c) has its input coupled to a set of signal lines determined in a one-to-one correspondence.

The outputs of NAND circuit 950a–950c are applied to drive circuits Da–Dc, respectively. Each of drive circuits Da–Dc includes CMOS transmission gates 952 and 954 shown in FIG. 30, transistors 953, 955, and an inverter 951. When selected, drive circuit D transmits the output of Z level shift circuit 905 to a corresponding word line WLka, WLkb (k=1-3).

In the structure shown in FIG. 31, predecoder 901 predecodes an address signal of 7 bits including a total of 6 bits which is formed of two bits for each of signal buses PA1–PA3 and 1 bit for signal lines Z0, Z1 (AZ). Signal buses PA1–PA3 and AZ may include more signal lines. In this case, the number of address signal bits is increased.

The output of predecoder 901 is also provided to the source line decoder.

Embodiment 6

In the above-described embodiments 1–4, the voltage conversion circuit is provided in a word line driver portion which directly drives a word line. In contrast, the structures shown in FIGS. 13 and 18 allow generation of a voltage of a desired level for the signal level of an input signal IN. More specifically, in voltage conversion circuit 304 (refer to FIG. 13) or 420 (refer to FIG. 18), when 0 V and 5 V are initially latched in the input signal IN, the output signal OUT attains the voltage level of node N2 or N12, and node N1 or N11, respectively. Therefore, a voltage level of 0 V, 5 V, and −10 V (in the case of a circuit structure generating negative voltage) can be selectively generated according to the latch data.

It is therefore possible to apply 5 V to a power source to transmit −10 V to a selected word line by using this circuit. If the memory cell array includes a block division structure and erase can be carried out in sectors, 0 V can be transmitted instead of a negative voltage to non-selected sectors.

The structure shown in FIGS. 13 and 18 can be provided to, not only in a portion directly driving a word line, but to a circuit selectively using voltages of 0 V, 5 V and −10 V (or 12 V). In this case, the level of the voltage generated by voltage converting circuit 304 or 420 is set in advance by an input signal IN. Therefore, the voltage generating circuit of the present invention is not limited to the usage in the section of driving a word line.

In the present invention, the voltage generating circuit is used in a flash memory. However, the present invention is applicable to any semiconductor device that operates by a power source of 5 V only, for example, and that has a structure of internally generating a plurality of types of voltages.

Embodiment 7

Figure 32:
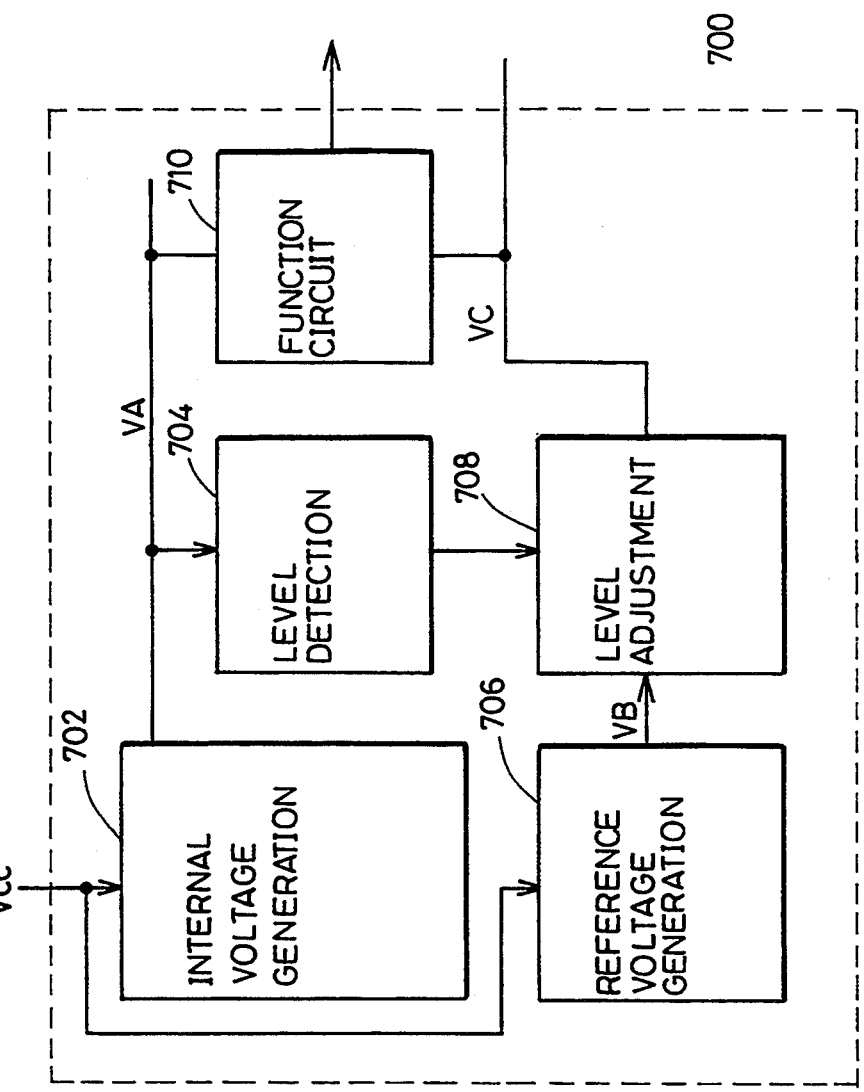
FIG. 32 shows a structure of a seventh embodiment of the present invention.

FIG. 32 shows a structure of a semiconductor device according to a seventh embodiment of the present invention. Referring to FIG. 32, a semiconductor device 700 includes an internal voltage generating circuit 702 for generating a desired internal voltage VA according to an externally applied power supply voltage Vcc, a level detection circuit 704 for detecting the level of an internal voltage VA generated by internal voltage generation circuit 702, a reference voltage generating circuit 706 for generating a predetermined reference voltage VB according to the power supply voltage Vcc, a level adjusting circuit 708 for adjusting the level of the reference voltage VB generated by reference voltage generating circuit 706 according to the level of the voltage VA detected by level detection circuit 704 to generate a voltage VC, and a function circuit 710 operating using voltages VA and VC.

Internal voltage generating circuit 702 corresponds to the negative voltage generating circuit of the preceding embodiments, and reference voltage generating circuit 706 corresponds to ground potential or power supply potential generating circuit (pad). This may be a reference voltage of another predetermined level (FIG. 32 shows this state). Level adjusting circuit 708 corresponds to a voltage conversion circuit to adjust the level of the reference voltage VB according to the voltage level detected by level detection circuit 704. Function circuit 710 operates using voltages VA and VC. In this case, function circuit 710 may be a circuit that operates with the voltage VA as one power supply voltage to make determination of the H or L level of the input signal with the voltage VC from level adjusting circuit 708 as the reference voltage. In this case, the reference voltage is adjusted according the voltage level of the internal voltage VA. This gives the advantage of carrying out a more accurate level determination operation. The voltage VA may be one operating power supply voltage, and the voltage VC the other operating power supply voltage.

Because the present invention is implemented so that the voltage level of one operating power supply voltage is shifted in the level changing direction of the other operating power supply voltage changed in level, the voltage applied to the transistor which is a component can be reduced, and a reliable semiconductor device that has steady operation can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    an output circuit operating with voltage signals on a first and a second supply line as operating power supply voltages for producing a signal of a level of a voltage on one of the first and second supply lines in accordance with an input signal;
    means for transmitting a signal of either of a first voltage level and a second voltage level onto the first supply line; and
    shifting means in response to a voltage shifting toward the first voltage level on the first supply line for shifting in voltage level a third voltage level signal on the second supply line toward the first voltage level.

2. A semiconductor device according to claim 1, wherein said shifting means includes
    first means provided between a node for supplying a voltage of the second voltage level and the first supply line for generating a voltage signal as a function of the voltage level on the first supply line at a first node,
    second means provided between a node for supplying a voltage of the third level and the first node for transferring a voltage signal on the first node to a second node, and
    amplifying means operating with voltage signals of the second and third voltage signals as operating power supply voltages, for amplifying the signal on the second node onto the second supply line.

3. A semiconductor device according to claim 2, wherein said first means includes a resistance element between the node for supplying the voltage of the second voltage level and the first node, and conduction means provided between the first node and the first supply line, and responsive to the voltage on the first supply line for conducting to change a voltage level at the first node according to the voltage level on the first supply line when the voltage level on the first supply line attains a predetermined level.

4. A semiconductor device according to claim 3, wherein said conduction means includes a resistance-connected field effect transistor.

5. A semiconductor device according to claim 3, wherein said conduction means includes a diode-connected field effect transistor connected between the first node and the first supply line in a forward direction.

6. A semiconductor device according to claim 3, wherein said conduction means includes a field effect transistor having a conduction terminal and a control terminal coupled together to the first supply node and another conduction terminal coupled to the first node, and a substrate region connected to receive a voltage of the second voltage level.

7. A semiconductor device according to claim 2, wherein said second means includes a first field effect transistor of a first conductivity type having a conduction terminal coupled to receive a voltage of the third voltage level, another conduction terminal connected to the second node, and a control gate coupled to receive a voltage of the second voltage level, and a second field effect transistor of a second conductivity type having a conduction terminal coupled to said first node, another conduction terminal coupled to the second node, and a control gate connected to receive a voltage of the second voltage level.

8. A semiconductor device according to claim 1, wherein said output circuit includes latch circuit means for latching the input signal and for generating an output signal of a voltage level of either of the first and second voltage levels in accordance with the latched input signal.

9. A semiconductor device according to claim 8, wherein said output circuit further includes means for holding an input node of the latch circuit means in an electrically floating state after latching of the input signal by the latch circuit means.

10. A semiconductor device according to claim 8, wherein said output circuit further includes means for holding an input node of the latch circuit means at a voltage level of the second voltage level in an electrically floating state.

11. A semiconductor device according to claim 1, wherein said shifting means includes:

a precharging means for precharging a first node at a voltage of the third voltage level, coupling means for capacitively coupling the first node with the first supply line, and holding means for holding a voltage level of the second supply line at the same level as the voltage level at the first node.

12. A semiconductor device according to claim 11, wherein said holding means includes:

comparing means for comparing the voltage signals on the first node and the second supply line and for amplifying the voltage difference between the first node and the second supply line, and establishing means responsive to an output of the comparing means for establishing a voltage level on the second supply line such that the voltage difference becomes naught.

13. A semiconductor device according to claim 11, wherein said holding means includes:

a first field effect transistor of a first conductivity type having a control gate connected to the first node, a second field effect transistor of a second conductivity type having a conduction terminal connected to another conduction terminal of the first field effect transistor, and another conduction terminal connected to receive a voltage at the third voltage level, a third field effect transistor of the first conductivity type having a conduction terminal connected to another conduction terminal of the first field effect transistor and to receive a voltage of the second voltage level, and a control gate connected to the second supply line, a fourth field effect transistor of the second conductivity type having a control gate and a conduction terminal connected together to a control gate of the second field effect transistor, and another conduction terminal connected to receive a voltage at the third voltage level, and an inverter having an input connected to the another conduction terminal of the first field effect transistor and an output connected to the second supply line.

14. A semiconductor device according to claim 1, wherein said output circuit includes a latch circuit means for latching the input signal.

15. A semiconductor device according to claim 14, wherein said latch circuit means includes;

a first field effect transistor of a first conductivity type having one conduction terminal connected to said second supply line, another conduction terminal connected to a first node receiving the input node, and a control terminal connected to a second node, a second field effect transistor of a second conductivity type having one conduction terminal connected to said first node, another conduction terminal connected to the first supply line, and a control gate connected to said second node, a third field effect transistor of the first conductivity type having one conduction terminal connected to said second supply line, another conduction terminal connected to the second node, and a control gate connected to said first node, and a fourth field effect transistor of the second conductivity type having one conduction terminal connected to the first supply line, another conduction terminal connected to said second node, and a control gate connected to said first node, said second node serving as a node for generating an output signal of the output circuit.

16. A semiconductor device according to claim 1, wherein said shifting means includes means responsive to the second voltage level signal on the first supply line for transmitting the third voltage level signal on the second supply line and responsive to transition from the second voltage level signal to the first voltage level signal on the first supply line for changing the third voltage level signal to the second voltage level signal.

17. A semiconductor device according to claim 1, wherein the first voltage level is a negative voltage level, the second voltage level is a ground voltage level, and the third voltage level is a positive power supply voltage level.

18. A semiconductor device according to claim 1, wherein the second voltage level is a positive power supply voltage level, the first voltage level is a voltage level higher than the second voltage level, and the third voltage level is a ground voltage level.

19. A non-volatile semiconductor memory device, comprising:
a plurality of non-volatile memory cells arranged in a matrix of rows and columns,
a plurality of word lines arranged on respective rows, each of the word lines connecting memory cells on an associated row,
row decoder means for decoding an address signal,
drive means provided for each said word line and responsive to an output of the row decoder means for transferring a voltage signal on either of a first supply line and a second supply line onto a selected word line,
generator means responsive to an predetermined operation mode instructing signal for generating and supplying a voltage signal of a first level onto the first supply line, and
adjusting means in response to the generation of the first level voltage signal for adjusting a voltage on the second supply line so as to reduce a voltage difference between the first and second supply lines.

20. A non-volatile semiconductor memory device according to claim 19, wherein said drive means includes
voltage switch means using the voltages on the first and second supply lines as operating power supply voltages and responsive to the output of the decoder means for producing a signal of a level of the voltage on one of the first and second supply lines, and
transfer means responsive to a signal produced by the voltage switch means for transferring a voltage signal on the first supply line to the associated word line.

21. A non-volatile semiconductor memory device according to claim 19, wherein said adjusting means includes,
first means provided between a node for supplying a voltage of the second voltage level and the first supply line for generating a voltage signal as a function of the voltage level on the first supply line at a first node,
second means provided between a node for supplying a voltage of a third level and the first node for transferring a voltage signal on the first node to a second node, and
amplifying means operating with voltage signals of the second and third voltage signals as operating power supply voltages, for amplifying the signal on the second node onto the second supply line.

22. A non-volatile semiconductor memory device according to claim 21, wherein said first means includes
a resistance element connected between the node for supplying the voltage of the second voltage level and the first node, and
conduction means provided between the first node and the first supply line, and responsive to the voltage on the first supply line for conducting to change a voltage level at the first node according to the voltage level on the first supply line when the voltage level on the first supply line attains a predetermined level.

23. A non-volatile semiconductor memory device according to claim 22, wherein said conduction means includes a resistance-connected field effect transistor.

24. A non-volatile semiconductor memory device according to claim 22, wherein said conduction means includes a diode-connected field effect transistor connected between the first node and the first supply line in a forward direction.

25. A non-volatile semiconductor memory device according to claim 22, wherein said conduction means includes a field effect transistor having a conduction terminal and a control terminal coupled together to the first supply line and another conduction terminal coupled to the first node, and a substrate region connected to receive a voltage of the second voltage level.

26. A non-volatile semiconductor memory device according to claim 21, wherein said second means includes
a first field effect transistor of a first conductivity type having a conduction terminal coupled to receive a voltage of the third voltage level, another conduction terminal connected to the second node, and a control gate coupled to receive a voltage of the second voltage level, and
a second field effect transistor of a second conductivity type having a conduction terminal coupled to said first node, another conduction terminal coupled to the second node, and a control gate connected to receive a voltage of the second voltage level.

27. A non-volatile semiconductor memory device according to claim 20, wherein said voltage switch means includes
latch circuit means for lathing the input signal and generating an output signal of a voltage level of either of the first and second voltage levels in accordance with the latched input signal.

28. A non-volatile semiconductor memory device according to claim 27, wherein said voltage switch means further includes means for holding an input node of the latch circuit means in an electrically floating state after latching of the input signal by the latch circuit means.

29. A non-volatile semiconductor memory device according to claim 27, wherein said voltage switch means further includes means for holding an input node of the latch circuit means at a voltage-level of the second voltage level in an electrically floating state.

30. A non-volatile semiconductor memory device according to claim 19, wherein said adjusting means includes:
a precharging means for precharging a first node at a voltage of a third voltage level,
coupling means for capacitively coupling the first node with the first supply line, and
holding means for holding a voltage level of the second supply line at the same level as the voltage level at the first node.

31. A non-volatile semiconductor memory device according to claim 30, wherein said holding means includes:

coupling means for comparing the voltage signals on the first node and the second supply line and for amplifying the voltage difference between the first node and the second supply line, and establishing means responsive to an output of the comparing means for establishing a voltage level on the second supply line such that the voltage difference becomes naught.

32. A non-volatile semiconductor memory device according to claim 30, wherein said holding means includes:

a first field effect transistor of a first conductivity type having a control gate connected to the first node, a second field effect transistor of a second conductivity type having a conduction terminal connected to another conduction terminal of the first field effect transistor, and another conduction terminal connected to receive a voltage at the third voltage level, a third field effect transistor of the first conductivity type having a conduction terminal connected to another conduction terminal of the first field effect transistor and to receive a voltage of the second voltage level, a control gate connected to the second supply line, a fourth field effect transistor of the second conductivity type having a control gate and a conduction terminal connected together to a control gate of the second field effect transistor, and another conduction terminal connected to receive a voltage at the third voltage level, and an inverter having an input connected to the another conduction terminal of the first field effect transistor and an output connected to the second supply line.

33. A non-volatile semiconductor memory device according to claim 19, wherein the first voltage level is a negative voltage level, and said adjusting means changes a power supply voltage to a ground potential level voltage.

34. A non-volatile semiconductor memory device according to claim 19, wherein the first voltage level is a voltage level higher than a positive power supply voltage, and said adjusting means changes a ground potential level voltage to the positive power supply voltage.

35. A non-volatile semiconductor memory device according to claim 20, wherein said voltage switch means includes:

shifting means for shifting in voltage level an output of said decoder means toward the first voltage level on the first supply line, and amplifying means using the voltages on the first and second supply lines as operating power supply voltages and amplifying a voltage signal received from the shifting means through bi-level processing.

36. A non-volatile semiconductor memory device according to claim 34, wherein said shifting means includes a first voltage divider including resistance elements connected in series between the first supply line and a node receiving a voltage at a third level, and a second voltage divider including resistance elements connected in series between the first supply line and a node receiving a voltage of the second level.

37. A semiconductor device comprising:

an output circuit responsive to an input signal for generating an output signal of a voltage level of either of voltages on a first supply line and a second supply line;

a first voltage supply means for supplying a first voltage of either one of a first level and a second level on the first supply line; and a second voltage supply means for detecting a level of a voltage supplied from said first voltage supply means and for supplying a second voltage of either one of the second level and a third level on the second supply line according to the result of detection.

38. A semiconductor device according to claim 37, wherein said second supply means includes means for supplying the second voltage of the second level when detecting that the first supply means supplies the first voltage of the first level.

39. A semiconductor device according to claim 37, wherein said first level is a negative voltage level, said second level is a ground voltage level, and said third level is a positive power supply voltage level.

40. A semiconductor device according to claim 38, wherein said second level is a positive power supply voltage level, said third voltage is a ground voltage level, and said first level is a predetermined voltage level higher than said positive power supply voltage.

41. A non-volatile semiconductor memory device, comprising:

a memory cell array including a plurality of non-volatile memory cells arranged in rows and columns;

a plurality of word lines provided corresponding to said rows, each of said word lines connecting memory cells of a corresponding row;

predecode means operating with a first level voltage and a second level voltage as operating power supply voltages for predecoding an address signal to generate a first predecode signal and a second predecode signal;

voltage generating means responsive to an operation mode instructing signal for generating a third level voltage;

level convert means for converting the first and second predecode signals into a first shift signal and a second shift signal of the first and third voltage levels while maintaining the logical value of the first and second predecode signals;

decode means operating with the first and third level voltages as operating supply voltages for decoding the first predecode signal to generate a row selection signal; and drive means responsive to said row selection signal for transferring the second shift signal onto a word line selected by said row selection signal.

42. A non-volatile semiconductor memory device according to claim 41, wherein said level convert means includes means responsive to generation of the third level voltage for shifting a level of the second level voltage to a level of the first level voltage and instead shifting a level of the first level voltage to a level of the third level voltage.

43. A non-volatile semiconductor memory device according to claim 41, wherein the third level voltage is a negative level voltage, the first level voltage is a ground level voltage, and the second level voltage is a positive power supply voltage.

44. A non-volatile semiconductor memory device according to claim 41, wherein said level convert means includes means responsive to generation of the third level voltage for shifting a level of the second level voltage to a level of the third level voltage.

45. A non-volatile semiconductor memory device according to claim 44, wherein said second level voltage is a positive power supply voltage, said first level voltage is a ground level voltage, and said third level voltage is a voltage higher than said positive power supply voltage.

46. A non-volatile semiconductor memory device according to claim 41, wherein said voltage generating means includes first means responsive to a first instructing signal for generating a negative level voltage, and second means responsive to a second instructing signal for generating a positive high voltage higher than a positive power supply voltage, and wherein said level convert means includes;

control means responsive to generation of said negative level voltage for converting the second level voltage into the first level voltage and responsive to generation of said positive high voltage for converting the second voltage into the positive high voltage; and latch means operating with an output voltage of said control means and an output voltage of said first means as operating power supply voltages for latching and level-shifting a received predecode signal.

47. A non-volatile semiconductor memory device according to claim 46, wherein said level convert means further includes means responsive to one of the second instructing signal and generation of the negative level voltage for isolating said latching means from the decode means.

48. A non-volatile semiconductor memory device according to claim 41, wherein said level convert means includes means responsive to the operation mode instructing signal for reversing a logic level of the second predecode signal.

49. A method of operating a semiconductor device including an output circuit operating with voltage signals on a first and a second supply line as operating power supply voltages for producing a signal of a level of a voltage on one of the first and second supply lines in accordance with an input signal, comprising the steps of:

transmitting a signal of either of a first voltage level and a second voltage level onto the first supply line; and shifting in response to a voltage shifting toward the first voltage level on the first supply line for shifting in voltage level a third voltage level signal on the second supply line toward the first voltage level.

50. A method according to claim 48, wherein said step of shifting includes the steps of detecting transmission of the first voltage level signal on the first supply line; and changing the third voltage level signal to the second voltage level signal.

51. A method of operating a semiconductor device, comprising the steps of:

responsive to an input signal for generating an output signal of a voltage level of either of voltages on a first supply line and a second supply line;

supplying a first voltage of either one of a first level and a second level on the first supply line; and detecting a level of a voltage supplied from said first voltage supply means and for supplying a second voltage of either one of the second level and a third level on the second supply line according to the result of detection.

* * * * *